(12) United States Patent
Atwood et al.

(10) Patent No.: US 6,949,782 B2
(45) Date of Patent: Sep. 27, 2005

(54) SEMICONDUCTOR MEMORIES

(75) Inventors: Bryan Atwood, Kokubunji (JP); Kazuo Yano, Hino (JP); Tomoyuki Ishii, Hachioji (JP); Taro Osabe, Kokubunji (JP); Kazumasa Yanagisawa, Kokubunji (JP); Takeshi Sakata, Hino (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/790,183

(22) Filed: Mar. 2, 2004

(65) Prior Publication Data

US 2004/0164326 A1 Aug. 26, 2004

Related U.S. Application Data

(63) Continuation of application No. 10/167,754, filed on Jun. 11, 2002, now Pat. No. 6,787,835.

(51) Int. Cl.[7] .......................................... H01L 27/108
(52) U.S. Cl. ....................... 257/296; 257/299; 257/300; 257/305

(58) Field of Search .................................. 257/296–310

(56) References Cited

U.S. PATENT DOCUMENTS

| | | | |
|---|---|---|---|
| 4,803,664 A | 2/1989 | Itoh | |
| 5,492,851 A | 2/1996 | Ryou | |
| 5,646,903 A * | 7/1997 | Johnson | 365/230.05 |
| 5,977,591 A | 11/1999 | Fratin et al. | |

* cited by examiner

Primary Examiner—Fetsum Abraham
(74) Attorney, Agent, or Firm—Reed Smith LLP; Stanley P. Fisher, Esq.; Juan Carlos A. Marquez, Esq.

(57) ABSTRACT

A high integration dynamic random access memory is provided by this invention. Furthermore, a write method is provided such that the cell size of two-and three-transistor gain cell memories is reduced. A dynamic memory incorporating a thin-channel transistor as the write element such that long data storage retention is achieved in the memory devices of this invention. A dynamic memory cell having low operating power and high density is also realized by this invention.

17 Claims, 35 Drawing Sheets

| | | WRITE | | | READ | STANDBY |
|---|---|---|---|---|---|---|
| | | DATA SET | NODE CHARGE TRANSFER | NODE SHUTOFF | | |
| | DT0,1 "0" STATE | 2V | 2V | 2V | FLOAT HIGH | 2V |
| | DT0,1 "1" STATE | 0 | 0 | 0 | FLOAT HIGH | 2V |
| | WW0 | 0 | 2 | 0 | 0 | 0 |
| | WR0 | 0 | 0 | 0 | 2V | 0 |
| | TR | 0 | 0 | 0 | 0 | 0 |
| | WW1, WR1 | 0 | 0 | 0 | 0 | 0 |

(a)

(b)

(a)

(b)

(a)

(b)

SEMICONDUCTOR MEMORIES

This application is a Continuation of nonprovisional U.S. application Ser. No. 10/167,754 filed Jun. 11, 2002 now U.S. Pat. No. 6,787,835. Priority is claimed based on U.S. application Ser. No. 10/167,754 filed Jun. 11, 2002.

BACKGROUND OF THE INVENTION

1. Field of the Invention

The present invention relates to a semiconductor memory, especially a dynamic random access memory (DRAM), and more particularly, the present invention relates to a series of cell structures, arrangements, and activation schemes for high density, low power semiconductor memories.

2. Description of the Background

A conventional DRAM memory cell, consisting of one transistor and one capacitor (referred to as a 1T-1C configuration), is commonly used as a semiconductor memory when high bit density is required. This technology has several drawbacks and faces serious complications as device dimensions are scaled smaller. Most notably, since the DRAM cell has no internal gain, a high capacitance element (~30 fF) must be fabricated in each cell to store a charge large enough to be adequately detected. Therefore, complex capacitor structures and expensive materials must be used to build a device with adequate capacitance, which leads to expensive fabrication and incompatibilities with standard logic processes.

In response to these limitations, small area gain cell memory technologies have been proposed. These are configured as 2- or 3-transistor cells in which a charge is stored in such a way that the conduction of a readout transistor is altered, thus providing internal gain. However, these technologies exhibit various problems that limit their widespread acceptance. Among these problems, cell size is still much larger than that of DRAM. This is due to the extra area used for additional transistors or spacing due to wire routing. For example, in many cells, two data and two word lines are necessary, limiting the cell size to twice the line pitch.

Other problems exhibited by gain cell technologies include short retention periods due to low storage capacitance and high leakage currents. In addition, driving and sensing schemes are often more complex than those found in conventional DRAM memories. Complex fabrication processes may be necessary for multi-transistor gain cells, further reducing the likelihood of their use as a replacement for DRAM.

SUMMARY OF THE INVENTION

According to at least one preferred embodiment of the present invention, a memory is provided comprising a plurality of memory cells, each containing a gain cell structure. Furthermore, the present invention comprises a method of writing information in which the stored charge on the storage node has an inverse relation to the voltage of the data line. Whereas in a conventional memory the storage node is connected to a write data line through a write transistor, according to the present method the node normally attached to a write data line is fixed at a constant reference voltage. In this case, a constant voltage is written to the storage node regardless of the state of information.

Additionally, the capacitance between the data line and the storage node is exploited to write information to the cell. The voltage of this data line determines the information during the write operation. Before the write word line is activated, the data line is set in an inverse relation to the desired stored voltage value. The word line is subsequently activated and a charge is transferred to the storage node such that it is equalized to the constant voltage of the reference node. After the word line is deactivated, isolating the storage node from the reference voltage node, the data line is restored to its standby state voltage. This change in voltage of the data line causes a change on the storage node due to a capacitive relationship between the data line and the storage node, resulting in information being stored in the cell.

A semiconductor memory cell may achieve a smaller area by sharing the reference node between adjacent cells. In addition, since a constant voltage is written to the storage node, an additional voltage boost circuit for the word line becomes unnecessary, thus reducing the area required by the memory array peripheral circuits. This technique is used in several 2T and 3T memory cell structures presented according to the present invention.

Further, according to at least one embodiment of the present invention, a memory cell with internal gain having a thin-channel transistor is used as the charge transfer element to the storage node. This thin-channel transistor may be fabricated in several ways, but it is defined as having a channel region with a thickness less than or equal to 5 nm. The thin-channel transistor is characterized by a source-drain leakage current of no more than $10^{-16}$ Amperes. With this device, a 3-T (3 Transistor) memory cell may be fabricated with a retention time of over 100 times that of conventional cells, thereby making a 3-T cell a plausible solution as a low power dynamic memory.

According to the present invention, a memory is provided in which the memory cell combines the fixed voltage reference node writing method with the thin-channel charge transfer transistor to achieve a high-density, low-power dynamic memory. This memory cell may be fabricated in a 2-T configuration with a double-gate readout transistor and a 3-T cell in which separate storage and read transistors are included in each cell. In addition, a memory derived from the 2-T cell with series-connected memory cells arranged in subcolumns or parallel-connected memory cells arranged in subcolumns is also provided. The present invention results in a density approaching or surpassing that of conventional DRAM memories. Also, memory cells of this type, with an additional capacitive element to increase retention time, are also provided.

In at least one embodiment, a memory comprises a thin-channel transistor used in a memory cell in a four-transistor (4-T) configuration that exhibits a static operation. The memory cell preferably has two access transistors and two thin-channel transistors in a cross-coupling, self-restoring configuration. If the source-drain leakage current from the data line through the bulk transistor is higher than the leakage current from the storage node, a stable memory can be realized, obviating the need for a refresh operation. In addition, the thin-channel transistors may be fabricated in a much smaller area than bulk transistors, realizing a drastically reduced memory cell size. In a further embodiment, a separate two-transistor readout circuit is included in each cell to overcome the slow read time of the four-transistor cell. In this manner, a low power, high-speed memory cell is presented.

BRIEF DESCRIPTION OF THE DRAWINGS

For the present invention to be clearly understood and readily practiced, the present invention will be described in conjunction with the following figures, wherein like reference characters designate the same or similar elements, which figures are incorporated into and constitute a part of the specification, wherein.

DETAILED DESCRIPTION OF THE INVENTION

It is to be understood that the figures and descriptions of the present invention have been simplified to illustrate elements that are relevant for a clear understanding of the present invention, while eliminating, for purposes of clarity, other elements that may be well known. Those of ordinary skill in the art will recognize that other elements are desirable and/or required in order to implement the present invention. However, because such elements are well known in the art, and because they do not facilitate a better understanding of the present invention, a discussion of such elements is not provided herein. The detailed description will be provided herein below with reference to the attached drawings.

Figure 1:
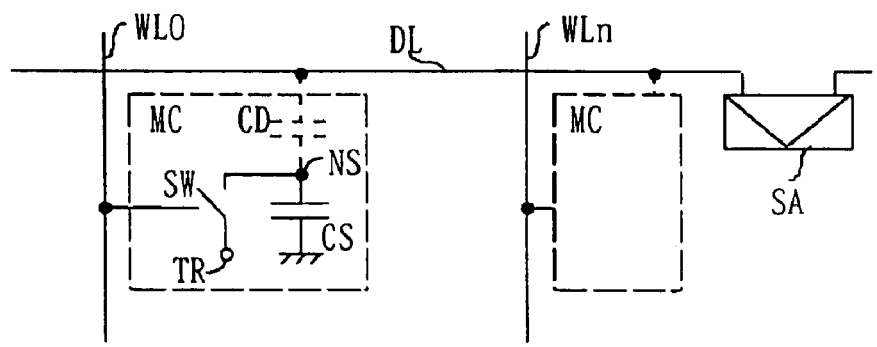
FIG. 1 is a circuit diagram explaining the capacitive coupling write method of a first exemplary embodiment.

In at least one preferred embodiment of the present invention, a memory cell is comprised of at least one switch element SW connected to one storage capacitor CS at the storage node NS, as illustrated in FIG. 1. The switch element SW is tied either to a fixed voltage reference node TR or a write data line. In addition, there is a data line DL that is connected to the cell in such a way that the relationship of the charge stored on the capacitor is inversely related to the voltage of the data line during the write word line activation period of the write cycle, for example a capacitive coupling CD between the data line and the storage node NS.

The method of writing information can be explained in the following manner in which binary value data is stored. In the case of writing a low value data as illustrated in FIG.

2a, the data line DL is held at the same voltage as it is during the data store state. Thereafter the write word line WL0 activates switch SW, allowing a charge to be transferred to the storage node NS such that the voltage on the storage node is equal to the fixed voltage of the reference node TR. The charge transfer switch SW is subsequently deactivated through the word line WL0, leaving a voltage on the storage node NS equal to the voltage of the reference node $V_{TR}$, representing a low value.

Figure 2A:
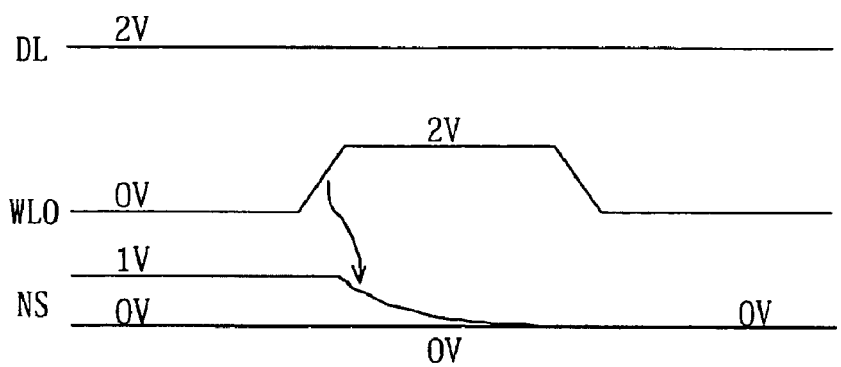
FIGS. 2A and 2B show access waveforms for a capacitive coupling write method circuit of a first exemplary embodiment.
Figure 2B:
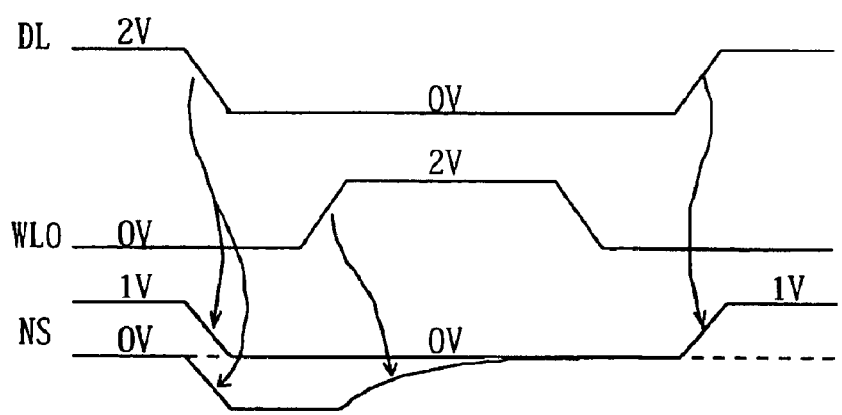

The high value data write operation is now described and illustrated in FIG. 2b. Initially, the data line DL is set at a voltage lower than that of the standby state. Thereafter, the switch SW is activated and deactivated in a similar manner to the low value data write operation, causing the storage node voltage $V_{NS}$ to equalize to the reference node voltage $V_{TR}$. At this point, the data line DL is restored to the voltage of the standby state. Since there is some mechanism, such as a capacitive coupling CD, which links the data line DL and the storage node NS, the voltage on the storage node will rise in some proportion to the change in voltage on the data line. For the diagram in FIG. 1, the voltage on the storage node NS will be equal to $V_{TR}+V_{DL}*CD/(CS+CD)$, where $V_{TR}$, $V_{DL}$, CD, and CS are the voltage of the reference node, the change in voltage on the data line, the data line to store node capacitance, and the store node capacitance, respectively. In this manner, a voltage value has been stored in the cell that is distinct from the case in which the voltage on the data line was not changed. Similarly, an inverse relation between the data line voltage and the cell storage charge is exhibited. This is in contrast to the conventional case, in which the voltage on the data line DL is directly transferred to the storage node NS through a conductive path. For a conventional write method, since the voltage on the storage node NS is set in a proportional manner to the voltage on the data line DL during the charge transfer phase, the charge on the storage node is directly proportional to the voltage on the data line.

As an example of a write method permitted by this invention, consider the ideal circuit of that shown in FIG. 1 in which there is a storage capacitor CS with a value of 1 fF, a switch SW connected between the storage capacitor and a ground terminal TR (0V), and a data line DL at a standby voltage of 2V with a capacitance CD of 1 fF connected between the data line and the storage node NS. During the write of the low value data as illustrated in FIG. 2a, the data line DL voltage is maintained at 2V while the charge transfer switch SW is opened. The voltage on the storage node NS equalizes to 0V when the word line WL0 is raised to 2V. After equalization, the word line is lowered to 0V, deactivating the write switch SW. In this manner, 0V has been stored on the storage capacitor CS.

During the write of the high value data as shown in FIG. 2b, the data line DL voltage is lowered to 0V. When the switch SW is activated, the storage node NS once again equalizes the source and drain voltages, storing 0V on the storage capacitor CS as in the low value write process. At this point, the data line DL is restored to 2V. The capacitive coupling CD between the data line DL and the storage node NS causes a voltage increase according to the equation: Change in voltage (node)=Change in voltage (data line)*C (data line to storage node)/C(total at storage node) [VN= VD*CS/CTOT]. In this case, the total capacitance is 2 fF, and thus, a change of 1V is observed at the storage node NS. In this manner, the low data value is 0V and the high data value is 1V.

Several phenomena are worth pointing out for this scheme. One is that the lowering and raising of the data line DL voltage will have no effect on memory cells connected to it that are not being accessed. This is because there is no path for the stored charge to move from the storage node NS even if the data line DL deviates from its standby voltage. Another effect is that all memory cells connected to the word line WL0 will be simultaneously written. This necessitates either new value data to be present on the data line DL or the previous contents of the cell must be present on the data line to avoid changes to the stored data. The specific benefits regarding semiconductor memories will be explained below.

The fundamental write operation has thus been described in which two distinct voltage values can be stored in a cell having a stored charge inversely proportional to the change in voltage on the data line. This operating concept, hereafter referred to as the "capacitive coupling write method," is used in at least one of the embodiments presented in this invention. The capacitive coupling write method can be extended to multiple data values by setting the data line to appropriate voltage values before the word line is activated, then restoring the data line to the standby voltage level. In this manner, multiple value data is stored in each cell, increasing the data density of the memory. Also, this operation does not preclude the use of an additional write data line as well. For example, the write data line voltage may be set to a certain level to ensure a fast write time and set to another level to ensure a long data retention. In addition to adjusting the voltage level of the read data line, the voltage level of the write data line can in part determine the data value of the storage node during the read operation. In this case, a high voltage is applied to the data line during a high data write cycle and a low voltage is applied to the data line during a low data write cycle.

Figure 3:
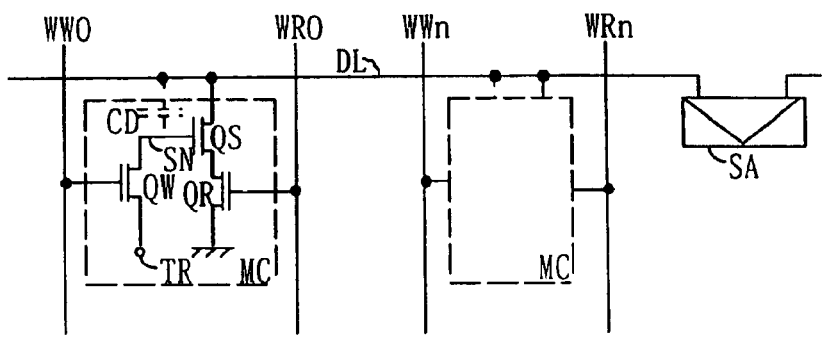
FIG. 3 is a circuit diagram for a 3T memory cell of a first exemplary embodiment.

A first exemplary embodiment of the present invention permits a semiconductor memory based on the capacitive coupling write method and comprises three transistors in a single memory cell MC, as illustrated in FIG. 3. Each memory cell MC comprises a storage transistor QS in which the gate of the transistor QS acts as the capacitor element of the storage node NS. A write transistor device QW used as the charge transfer element (i.e., SW) is activated by a write word line WW0 and is connected between the storage node NS and a fixed voltage reference TR. In addition, the data line DL is electrically connected to storage transistor QS by a capacitor CD. A read transistor QR is connected between the source of the storage transistor QS and a fixed voltage reference TR with a read word line WR0 electrically connected to the gate terminal.

Figure 5:
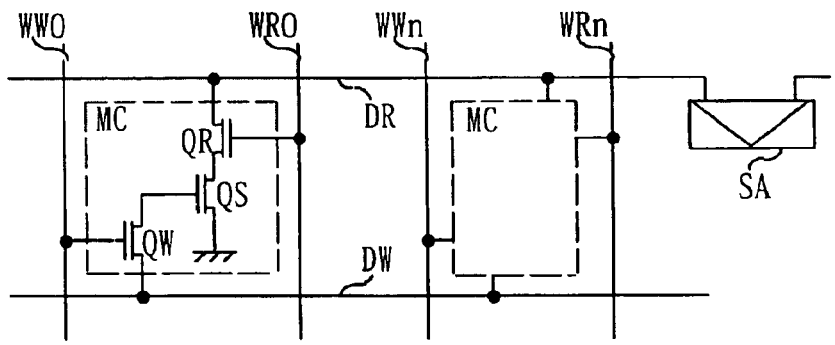
FIG. 5 shows a view of a conventional 3T memory cell configuration.

This structure can be compared with the conventional 3T structure as shown in FIG. 5. In the conventional cell, each memory cell MC consists of a storage transistor QS, a read transistor QR, and a write transistor QW as in the cell presented in this embodiment. However, the read transistor QR is directly connected to a read data line DR0 and the drain of the storage transistor QS, the source of the storage transistor is connected to a fixed voltage reference TR (0V) and the gate terminal acts as the storage node NS, and the write transistor QW connects a write data line DW and the storage node NS when activated by a write word line WW0 connected to the gate terminal.

Figure 6A:
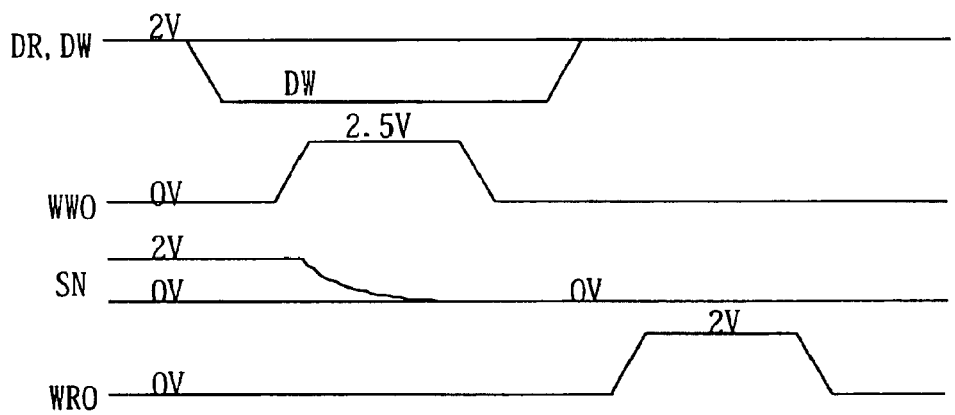
FIGS. 6A and 6B show access waveforms for the conventional 3T memory cell.
Figure 6B:
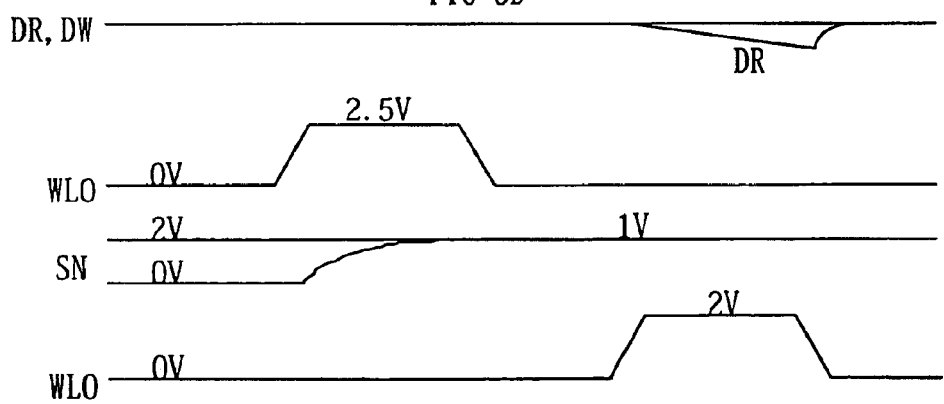

One difference between these structures is that for the conventional case the voltage stored on the storage node NS is set to the value of the write data line DW during access, as shown in the waveforms of FIGS. 6A and 6B. For the write operation, a voltage is presented to the write data line DW before the write word line WW0 is activated, a high voltage (2V) to write a high voltage data, and a low voltage to write a low voltage data. After the write word line WW0 is raised over one threshold voltage Vt above the supply voltage (2.5V), the storage node voltage is equalized to the write data line DW, followed by the deactivation of the write transistor QW by the lowering of the write word line WW0. The data line DW is then set to the voltage of the standby state (0V). In this manner, a charge is set on the storage node NS directly proportional to the voltage present on the write data line DW during the period when the write word line WW0 is activated.

Figure 4A:
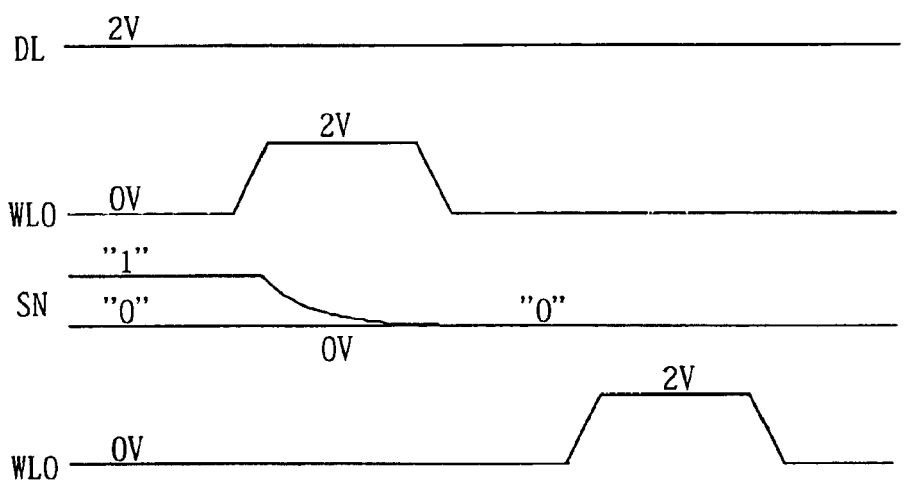
FIGS. 4A and 4B show access waveforms for a 3T memory cell of a first exemplary embodiment.
Figure 4B:
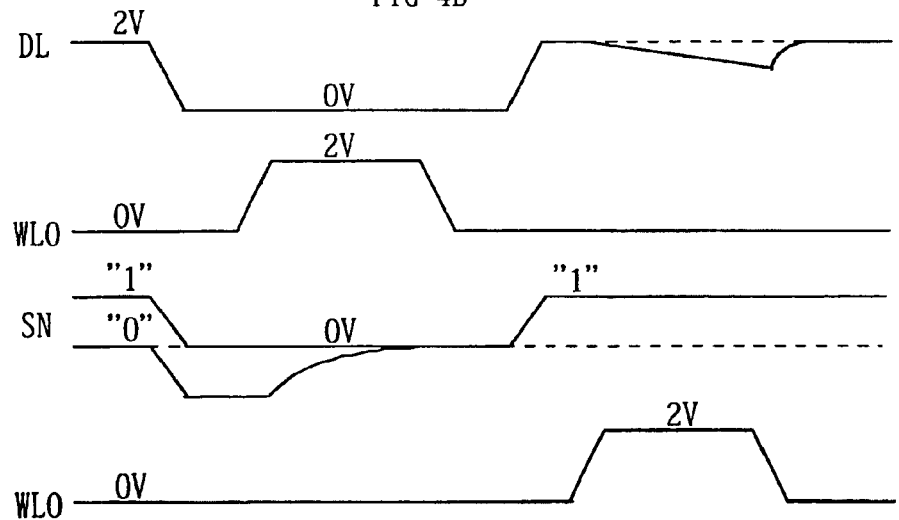

The write operation, shown if FIGS. 4A and 4B for the memory presented in this exemplary embodiment is based on the capacitive coupling method as described above, wherein a write word line WW0 activates the write transistor QW, equalizing the storage node NS and the fixed voltage reference TR. The data line DL voltage is adjusted in an inverse proportion to the desired storage node voltage before write word line WW0 activation and is restored to its standby voltage after the write operation. In other words, the data line DL is set at a low voltage (0V) for a high storage node data and a high voltage (2V) for a low storage node data. After the storage node NS is equalized to the fixed voltage reference TR (0V), the data line DL is restored to the standby state voltage (2V). Because a capacitive connection CD exists between the data line DL and the storage node NS consisting of the sum of the gate-source capacitance of the store transistor QS and the capacitance from the wire to the node, an increase in the voltage on the data line DL will cause an increase in the voltage on the storage node NS. Since the data line DL is unchanged when writing a low bit, as in FIG. 4A, the storage node NS remains at the reference voltage (0V).

If restoring from a low voltage (0V) to the standby voltage state (2V), as in FIG. 4B, a voltage is induced on the storage node NS according to Vd*Cd/Ctot, where Vd, Cd, and Ctot are the change in voltage on the data line, the capacitance from the data line to the storage node, and the total capacitance of the storage node, respectively. For example, if Vd=2V, Cd=1 fF, and Ctot=2 fF, a voltage of 1V is coupled to the storage node NS. Clearly, a higher signal margin is achieved with a higher change in data line voltage and a higher ratio of data line to storage node capacitance CD versus total storage node capacitance. It is notable that if the storage device enters the conduction region as the data line DL is restored to its standby state voltage, the data line to storage node capacitance CD increases since the gate-source capacitance increases due to the conduction of the channel.

In the memory cell of this embodiment, since information is represented by a voltage set on the gate of the storage transistor QS, an adequate method of determining this data is to sense the change in conduction of the storage transistor. A read operation comprises setting the read transistor QR in the conduction region by activating the read word line WR0, then sensing the current generated through the data line DL or a by-product of this phenomenon. Since the conduction of the storage transistor QS depends on the voltage of its gate electrode, the current through the cell depends on the value of the data stored. In this embodiment, this conduction is sensed through a voltage sense amplifier SA connected to the data line DL. Before the read operation, the data line voltage is precharged to a set voltage and is then left floating. When the read word line WR0 is activated, the current drawn through the memory cell MC will cause a corresponding decrease in the voltage level of the data line DL resulting from the decrease in the charge stored on the data line. A voltage sense amplifier SA is used to sense this change in voltage and generate a digital signal corresponding to the information value of the memory cell MC.

Figure 7:
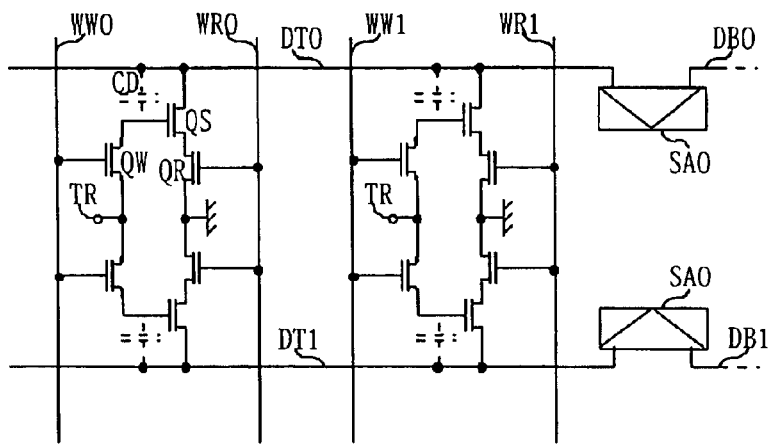
FIG. 7 is a circuit diagram and voltage table for a 3T memory cell of a first exemplary embodiment.

It is worth noting the benefits of the memory structure in this embodiment, which combines the write technique of the first exemplary embodiment with a 3T memory cell structure. FIG. 7 shows a 2×2 array of the memory of this embodiment, illustrating that by setting the write data line to a value that is independent of the data written, adjacent memory cells can share this node. Whereas in the conventional 3T case, a separate data line must be used for adjacent cells, this method allows the size of the memory cells to be reduced by sharing a single connection with an adjacent cell.

In addition, this technique does not require a word boosting technique, as is required for the conventional case. In the conventional case, a high and low value is written to the storage node by presenting Vdd (2V) or 0V to the write node, respectively. In the case of writing Vdd to the storage node, for a threshold voltage of the write transistor Vt (i.e., 0.5V), a word line voltage must be boosted to Vdd+Vt (i.e., 2.5V) to ensure adequate voltage transfer. For the capacitive coupling write method presented in this invention, since the write node can be set to a low voltage (0V), the write voltage can be set so that it does not require a boosted voltage (i.e., 2V). In other words, because a low voltage is written in both cases, the write voltage always maintains a difference larger than Vt even without a boosted voltage circuit. Therefore, this memory can reduce the size of the peripheral circuits as well as operation power since high area, high power word boosting circuit techniques are obviated. FIG. 7 also lists an example of the operating voltages for an array of memory cells during the read, write, and standby states. Voltage boosting or down converting is not necessary for operation of this memory device.

Figure 8:
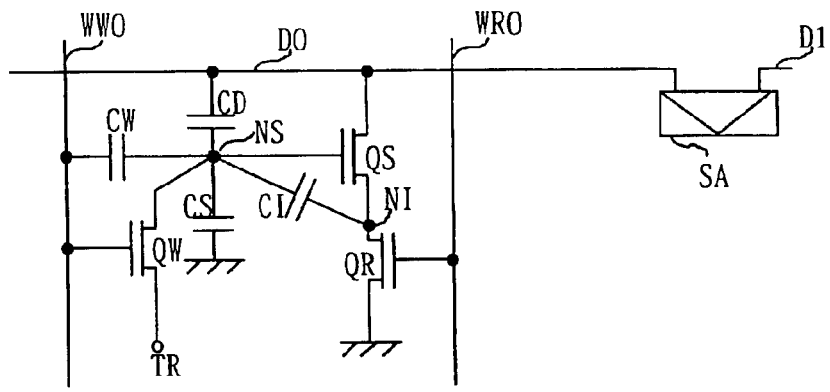
FIG. 8 is a circuit diagram for a 3T memory cell of a first exemplary embodiment.

In the memory cell of this embodiment, an N-channel device or P-channel device can be used as the storage device, or efforts can be made to adjust the threshold voltage of the device so that the data line to source node capacitance is increased during the write operation. In order to explain the occasions when these cases may be beneficial, a more accurate circuit diagram of the cell is presented in FIG. 8. In an actual semiconductor memories, there will exist a capacitance CW between the write word line WW0 and the storage node NS as well as a capacitance CI between the storage node NS and the intermediate node NI shared by the read transistor QR and the storage transistor QS.

Figure 9:
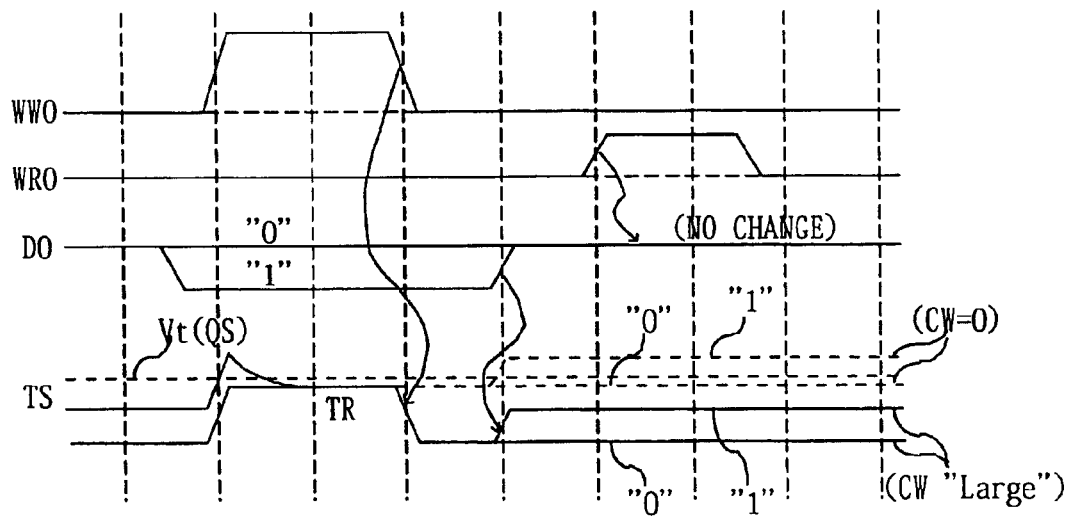
FIG. 9 is the access waveform for a 3T memory cell of a first exemplary embodiment.

During a write operation as illustrated in FIG. 9, after the storage node NS voltage is equalized to the write data node reference TR, the write word WW0 voltage is lowered to deactivate the write transistor QW. Since there is a capacitance CW between the write word line WW0 and the storage node NS, a voltage will be coupled to the storage node according to the equation VW*CW/CTOT, where VW, CW, and CTOT are the voltage change of the word line, the capacitance between the word line and the storage node, and the total capacitance of the storage node equal to the sum of CW, CS, CD, and CI, respectively. In this case, the voltage on the storage node is less than the value predicted if there is no capacitance between the word line WW0 and the storage node (CW=0 in FIG. 9). There are some cases where the voltage stored for both data values is too low to cause the storage transistor QS to enter the conduction region ("Large CW" in FIG. 9). In other words, the voltage may be below the threshold voltage for the N-channel storage transistor (Vt(QS) in FIG. 9).

An additional concern is the capacitive coupling CI between the intermediate node NI, and the storage node. In the standby state for the high value data, the voltage of the intermediate node NI will be at roughly the value of the read data line since the storage transistor QS is in the conduction region. During the read period, however, the voltage will decrease once the read transistor QS is activated. The decrease in voltage of the intermediate node NI will cause a decrease in voltage of the storage node NS according to $Vi*Ci/Ctot$, where Vi, Ci, and Ctot are the change in voltage at the intermediate node, the capacitance between the intermediate node and the storage node, and the total capacitance of the storage node, respectively.

This operation may cause the voltage of the storage node in the high value state to drop below the point at which the storage transistor QS conducts. One solution if there is a lack of conduction in either data state is to alter the threshold voltage of the storage transistor QS during processing so that at least the high value voltage is adequate to activate the read transistor QR into the conduction region. For an N-channel device, lowering the threshold voltage of the storage transistor QS may permit the device to conduct in the case where a standard threshold voltage is too high. Another solution is to substitute a P-channel storage transistor for the N-channel device. In the case of a P-channel device, the lower voltage state of the stored data will produce more conduction. Therefore, the negative voltage induced by the word line lowering and the intermediate node lowering will actually produce a greater conduction.

In addition, the N-channel write device may be replaced by a P-channel device. In this case, the word line polarity must be reversed, causing an increase in the voltage of the storage node on deactivation. The combination of these techniques can be considered such that the memory cell conducts an adequate current during the read operation for at least one of the data states of the memory cell. In summary, there are cases when an N-channel or P-channel storage transistor QS is more appropriate in this embodiment and later embodiments due to the effects explained here, namely an interaction of the various capacitances in the cell the prohibit adequate read operation for one of the types of transistors.

Figure 10:
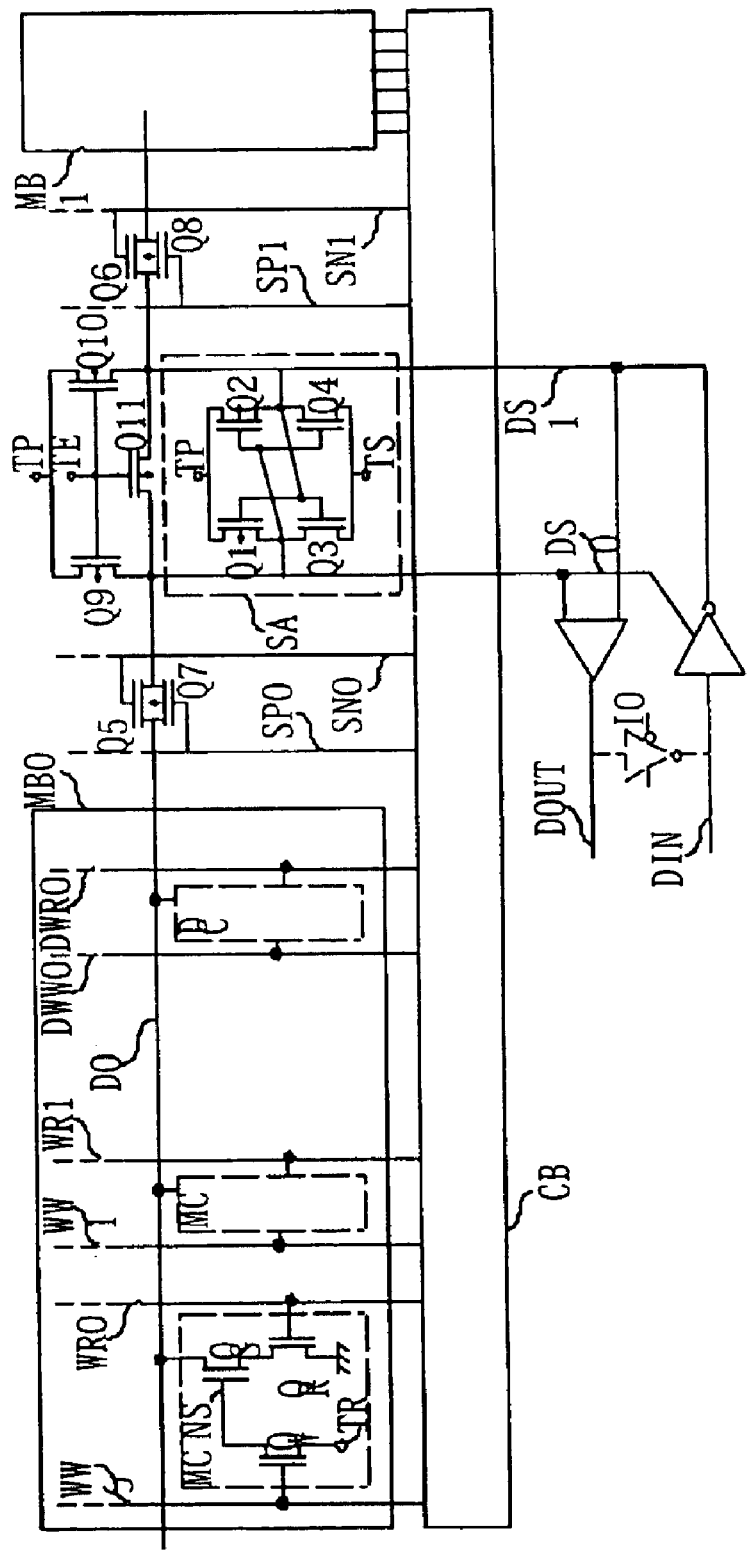
FIG. 10 is a circuit diagram for a semiconductor memory.

An array configuration with peripheral circuits for the semiconductor memory of this exemplary embodiment is shown in FIG. 10. Each memory cell MC contains the previously described 3T configuration and is connected to a data line D0. An array of memory cells with multiple data lines and multiple read and write word lines is arranged in a memory block MB0. In addition, a control block CB that controls the read WR0, WR1 and write WW0, WW1 word line signals is connected to the memory cells.

An additional component of this embodiment is a differential voltage sense amplifier SA used to determine the value of the information in the accessed memory cell. The amplifier SA comprises a pair of N-channel transistors (Q3, Q4) and a pair of P-channel transistors (Q1, Q2) in a self-restoring flip-flop configuration. This configuration is a suitable candidate because it may be fabricated in the small pitch of the memory cell. An additional feature of the sense amplifier SA is a P-channel pass transistor Q7 and an N-channel pass transistor Q5 that separate the memory cell data lines from the amplifier SA. When a small differential signal of 50–100 mV develops on the data lines during a read operation, the cutoff switches Q5 and Q7 are deactivated by the select lines (SP0, SN0) and the data line D0 is separated from the amplifier SA. The amplifier is then activated by a separate control signal TS to generate a full swing differential signal.

This sense amplifier SA structure has several beneficial features. The first is that since the information stored in the memory cell is not destroyed on a read operation, a rewrite operation after a read is unnecessary. Therefore, by separating the data lines from the sense amplifier during the amplification stage, a much faster read operation can be expected since the amplifier does not have to charge the data lines. Similarly, since the data lines are separated, a full voltage swing is not developed, and during the precharge phase, the data line must be charged by roughly 100 mV as opposed to a half-Vdd precharge as seen in conventional DRAM cells. Finally, the difference in data line capacitance will inevitably cause a noise source in the amplifier. Separating the data line during data amplification effectively reduces this noise source.

Also optionally included in the memory of this embodiment is a dummy cell structure DC. Each column of cells preferably includes a single dummy cell DC. This cell DC generates a signal approximately midway between the two values generated in a normal memory cell MC. During memory cell access, when the read word line is asserted for a cell connected to a data line, a dummy word read line is asserted for a dummy cell connected to a column whose electrical characteristics are approximately matched to the column of the memory cell being accessed. The use of the dummy cell DC drastically improves the speed of sensing for several reasons. Since a differential voltage sense amplifier SA is used to discriminate the data, the voltage of the accessed data line must be compared to a reference voltage. A dummy cell DC can generate a voltage reference relatively insensitive to temperature and process variations. In addition, several noise sources are generated during the access period, such as word line to data line noise. Since an equivalent noise is generated through the dummy cell DC, utilizing a dummy cell effectively cancels out many of these noise sources, reducing the time necessary for the sense amplifier SA to reliably determine the data.

The memory described in this embodiment is preferably organized in an "open data line" architecture in which a single word line activates a cell in every column over which it passes. This enables a higher memory density than the "folded data line" architecture used in conventional DRAM memories in which a word line activates memory cells in only half of the columns over which it passes.

Figure 11:
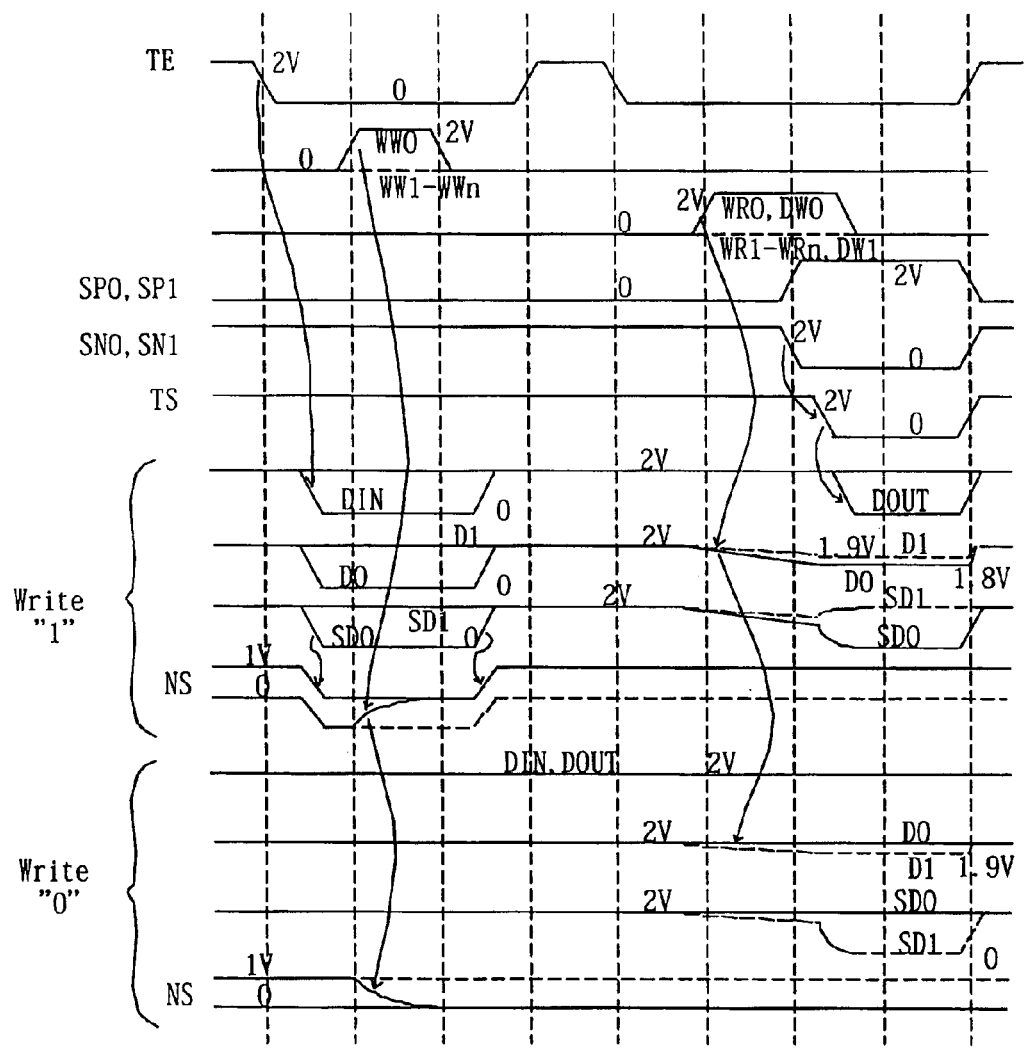
FIG. 11 shows the write and read access waveforms for a semiconductor memory.

The access and operation waveforms for the memory in this embodiment are shown in FIG. 11. In this example, the memory cells connected to write word line WW0 are first written, then read in sequence. The lower part of the chart is divided into two sections: one for the high data write access (WRITE "1") and one for the low data write access (WRITE "0"). The write operation follows the capacitive coupling write method described above, with the data line D0 set by DIN at an inversely proportional voltage to the charge being written. In addition, a data line to storage node capacitance CD is assumed to be one half of the total storage node capacitance CTOT in this example. Therefore, for a full data line swing of 2V in the high data write access, a 1V signal will develop on the storage node.

In the low data write access, the data line D0 is maintained at a high voltage while the word line WW0 is pulsed to equalize the storage node NS voltage to the fixed reference TR (0V). Since the data line D0 voltage does not change, the storage node NS voltage remains at a low state (0V) after the write operation. For the high data write operation, the data line DL is lowered to the low state (0V). The storage node voltage is equalized to 0 when the WW0 line is pulsed, then a data signal of 1V is stored according to the capacitive coupling write method when the D0 line is restored to the standby voltage (2V).

Data is read according to the procedure described earlier in which the WR0 line is activated, causing a decrease in the data line (D0,D1) voltages according to the conductance of the memory cell and dummy read transistors. Once a suitable signal is developed on the data lines, the pass transistors Q5,Q6,Q7,Q8 are deactivated by the select signals SP0,SN0, SP1,SN1 and the sense amplifier SA is activated by the signal TS. Finally, the amplified signal is read out to the D0UT terminal.

The memory described in this embodiment also preferably incorporates a refresh method in which the data for the row of cells being refreshed is first read and then directly written back into the cells. Initially, a standard read operation is performed in which the read word line WR0 is activated, the P-channel and N-channel pass transistor pair (Q5,Q7) is deactivated when an adequate sensing voltage is developed in the differential sense amplifier SA, and the sense amplifier is activated to generate a full swing signal. Following this operation, the P-channel and N-channel pass transistors Q5, Q7 are reactivated to present the fully amplified signal to the data lines. At this point, a write operation is performed in which the write transistor QW is activated and deactivated to equalize the storage node NS to allow the capacitive coupling write to occur. For the case of a high voltage stored in the memory cell with an N-channel storage transistor QS, a read operation will generate a higher current than the low voltage data, resulting in a lower data line voltage than the voltage of the data line connected to the dummy cell DC. Therefore, the differential sense amplifier SA will amplify this signal to the low supply rail. In other words, a high voltage stored in the cell will generate a low voltage in the sense amplifier SA, and vice versa. If the low supply voltage is presented to the data lines and a write operation is performed, a high voltage is rewritten to the storage node according to the capacitive coupling write method. Similarly, if the high supply voltage is presented to the data lines followed by a write operation, a low voltage is rewritten to the storage node.

In this manner, a simple refresh operation can be conducted as described. If a P-channel element is used as the storage element in the memory cell, a low voltage is read from the sense amplifier for a low voltage on the storage node. Therefore, this rewrite operation must include a voltage inversion circuit. For this reason, an inverter I0 can be inserted from the D0UT signal to the DIN signal and operated only during the refresh portion to ensure correct data polarity is rewritten to the cell. Similar to the first exemplary embodiment, there are cases in which the N-channel storage transistor can be substituted by a P-channel transistor. Alternative refresh methods are also contemplated with this embodiment, and exemplary additional refresh circuits are described below.

Figure 12:
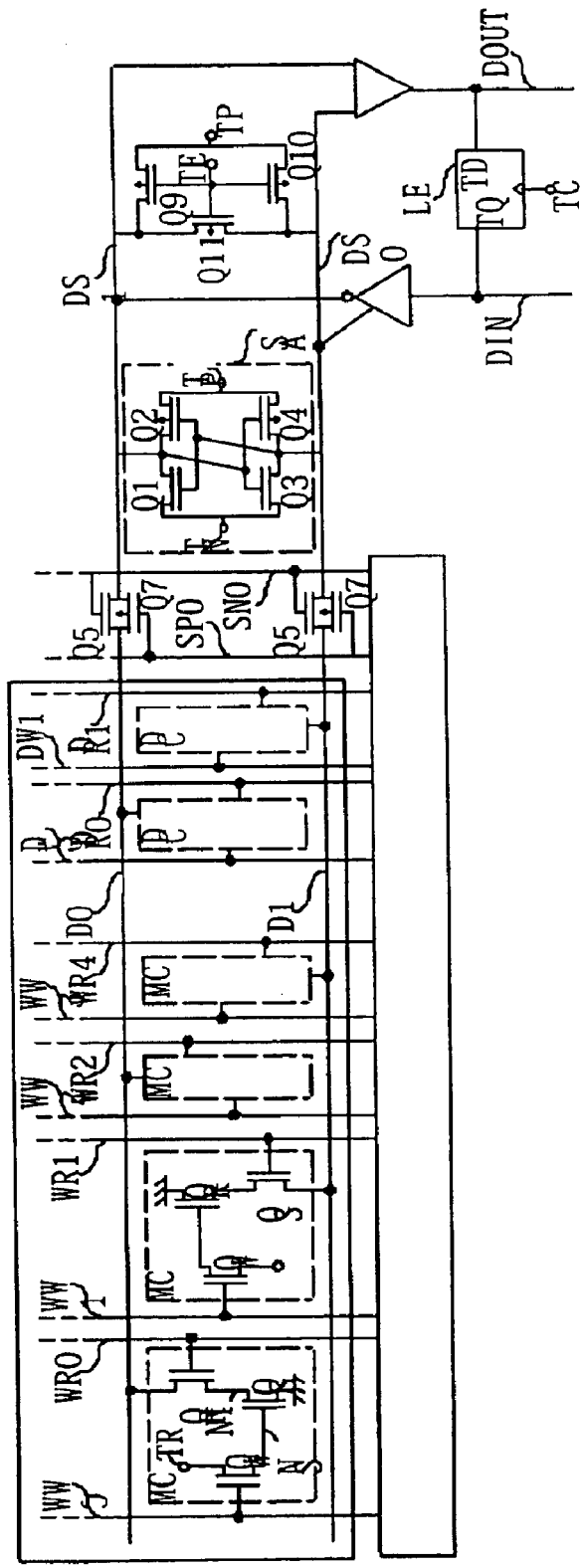
FIG. 12 is a circuit diagram for a semiconductor memory of a second exemplary embodiment.

In a second exemplary embodiment, a memory is provided according to FIG. 12, in which the structure of the memory cell MC comprises three transistors such that a read transistor QR is directly connected to the data line D0. In addition, a write transistor QW acts as a switch element from a fixed voltage reference TR to the storage node NS and a storage transistor QS is used such that the gate terminal acts as the storage node NS, with the source connected to a fixed voltage reference (i.e., ground) and the drain connected to the source region of the read transistor QR. The write operation is based on the capacitive coupling principle presented earlier in which the stored charge is inversely proportional to the data line during the charge transfer period of the read operation. The primary difference is that the capacitive coupling effect of the write cycle is generated from the capacitance between the intermediate node NI and the total capacitance of the storage node NS, further described below.

The benefits of this cell structure result from the separation of the storage transistor QS from the data line D0. Since the gate electrode voltage of the storage transistor QS varies according to the data stored in the memory cell, the gate to junction capacitance will also vary. If this junction is directly connected to the data line D0, as in the first exemplary embodiment, the capacitance of the data line may vary such that the differential voltage sensing is disturbed. In this embodiment, a read transistor QR is directly connected to the data line, presenting a constant bit capacitance to the data line, thereby potentially enabling a more robust read operation.

The memory according this embodiment also features a folded data line structure in which a single column of memory cells are connected to a pair of data lines D0,D1 such that the data lines are electrically balanced. Another preferred feature is that a single word line is only connected to one half of the cells that it crosses. Therefore, when a word line is activated, only one half of the data lines it crosses are activated. This enables differential signaling that cancels noise sources caused by the raising of the word lines and reduces noise sources due to the capacitance between adjacent data lines.

A sense amplifier SA is provided that has a similar structure as that in the first exemplary embodiment. This includes a flip-flop pair of two N-channel transistors Q1, Q3 and two P-channel transistors Q2, Q4. The sense amplifier SA will output a full voltage swing to the sense amplifier data lines SD0,SD0 upon activation by a lowering of the N-channel transistor source node TN. In this manner, a differential signal developed on the two data lines D0,D1 can be amplified to a full value voltage.

In this embodiment, two dummy cells DC are preferably included in each column with the output of one dummy cell connected to one of a pair of data lines D0, D1, and the output of the other connected to the other in a pair of data lines. As in the second embodiment, the dummy cell DC is constructed to generate a signal that is roughly midway between the two signals generated by a normal memory cell. During a read operation, data is presented to only one data line of a pair D0, D1 by the accessed memory cell. The activation of the dummy word line DR corresponding to the dummy cell DC connected to the other data line of the pair will present the reference signal. This pair is presented to the differential sense amplifier SA, which amplifies the difference on the data lines to a full voltage swing as described previously. The dummy cell solution allows an adequate reference to be generated for each data line pair D0, D1, resulting in a faster read operation.

Figure 13:
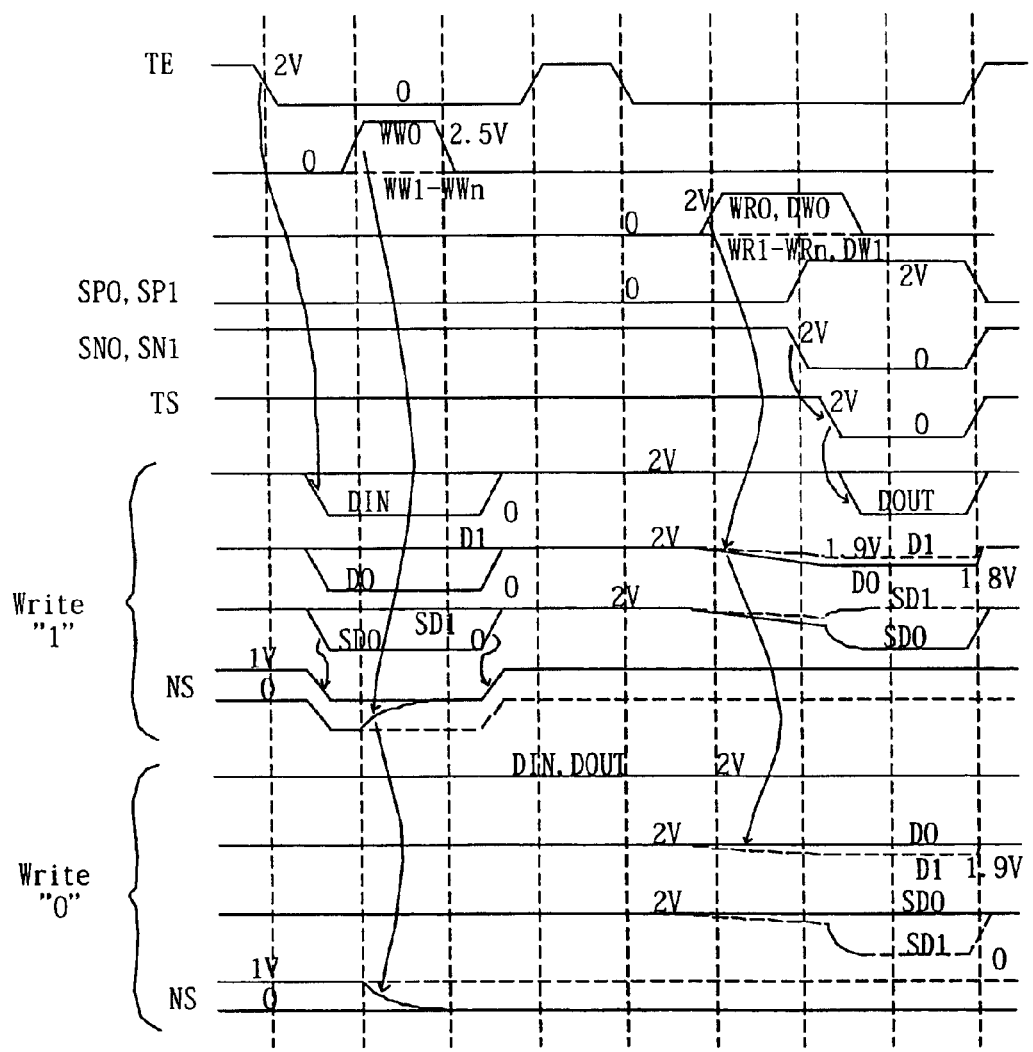
FIG. 13 shows the write and read access waveforms for a semiconductor memory.

The write operation proceeds according to the following principle as detailed by the waveforms in FIG. 13.

First, a voltage is presented to the data line D0. Similar to the first exemplary embodiment, a high voltage on the data line D0 will write a low voltage to the storage node NS, and vice-versa. This is followed by an activation of the read transistor QR to pass the data line voltage to the intermediate node NI. When the data line D0 is in the high state, if a boosted word read line WR0 voltage is used such that the word read line voltage is greater than or equal to the supply voltage Vdd (i.e., 2V) plus the transistor threshold voltage Vt (i.e., 0.5V), then the full signal of the data line D0 can be passed to the intermediate node NI. Otherwise, if the word read line WR0 voltage is equal to the supply voltage Vdd, then the voltage transferred to the intermediate node voltage is equal to Vdd−Vt (i.e., 1.5V).

This action is followed by an activation and subsequent deactivation of the write word line WW0 to equalize the storage node NS to that of the fixed voltage reference TR of the write transistor input. Next, the voltage of the data line D0 is returned to the standby state. For the case that the data line rises from 0 to Vdd (2V), the intermediate node voltage rises from 0 to Vdd−Vt (1.5V) for the case that the word read voltage is set at Vdd (2V). This action will couple a voltage to the storage node NS according to the capacitive coupling write method of approximately $V_i*C_i/C_{tot}$, where Vi, Ci, and Ctot are the change in intermediate node voltage, the intermediate node to store node capacitance, and the total capacitance of the store node. Finally, the read transistor QR is deactivated by the read word line WR0, electrically separating the cell from the data line D0.

The memory described in this embodiment preferably incorporates a refresh method divided into two separate cycles. In the first cycle, the data for the row of cells being refreshed is read into a storage register LE. This follows a similar operation as a standard read cycle in the first embodiment except that after the voltage is fully developed in the sense amplifier SA and the output data line DOUT, the data is stored in a register LE through the input TD by the activation of the data store signal at the node TC. In a subsequent cycle, the refresh operation continues with the voltage on the storage node NS being fully restored. During this cycle, the voltage stored in the storage register is presented to the input data DIN and passed to the read data line D0 directly through the activation of the N-channel and P-channel pass transistor pair Q5, Q7. After this data is set on the read data line, the write word line for the row under refresh is activated and deactivated, and then the data line is restored to a high voltage. In this manner, the data can be fully refreshed according to the capacitive coupling write method.

For the case where the store transistor is P-channel, the data register LE must be of the inverting type. This is because for a P-channel storage transistor QS, a low signal is generated on the data line during read if a high voltage is presented on the data line during the write operation. In this case, the storage register LE must output an inverted signal of the stored bit. One benefit of the division of the refresh operation into two cycles is that the access delay due to a refresh operation interruption may be reduced. This provides for a faster access if there is a refresh interruption versus the conventional case where a refresh cycle consists of a read operation immediately followed by a rewrite operation.

Figure 14:
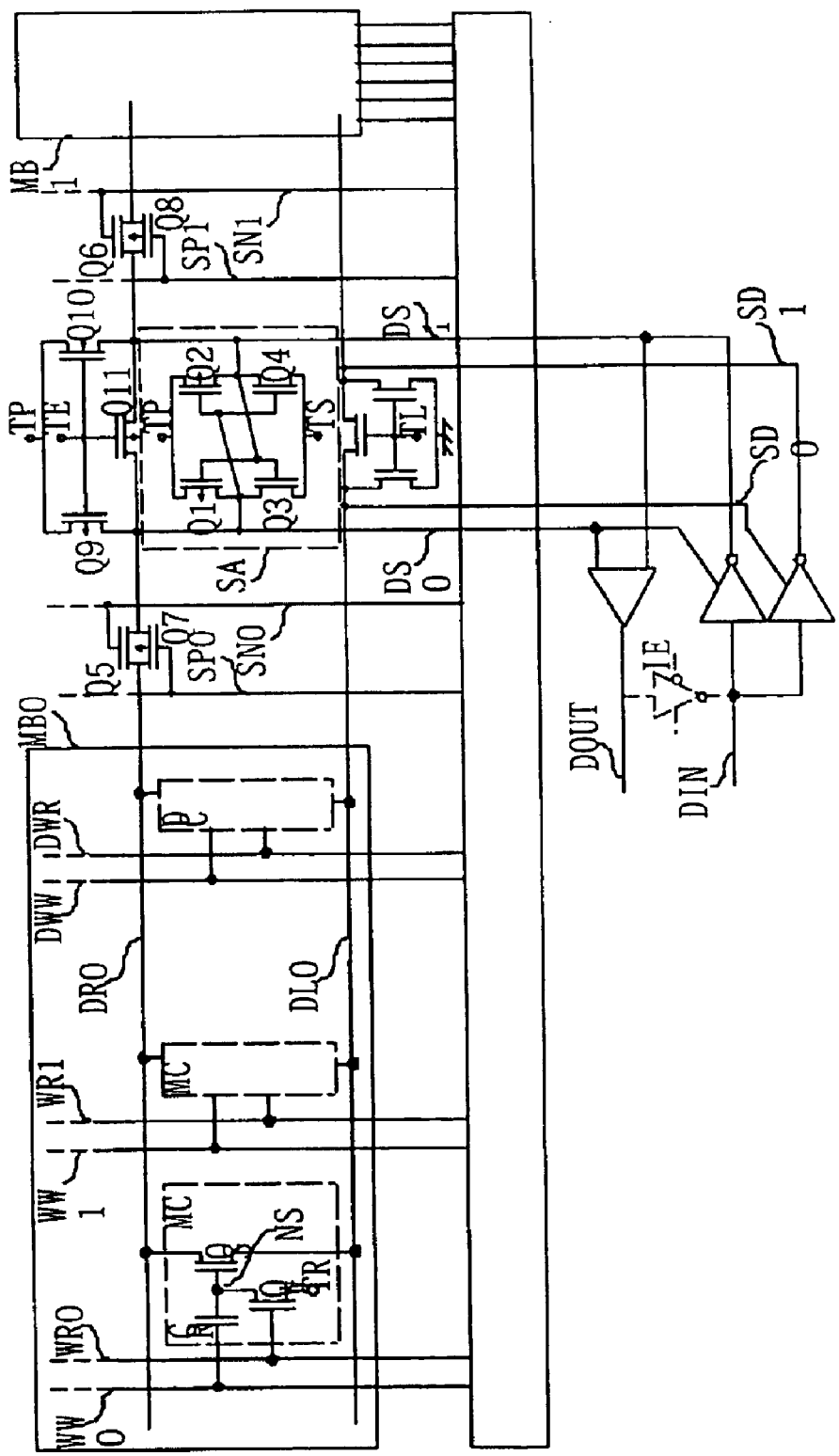
FIG. 14 is a circuit diagram for a semiconductor memory of a third exemplary embodiment.

A third exemplary embodiment of a memory as shown in FIG. 14 includes a basic cell comprising a storage transistor QS and a write transistor QW. The write transistor QS has the source node connected to a fixed voltage reference TR and the drain node connected to the gate terminal, or storage node NS, of the storage transistor QS. The source node and drain node of the storage transistor QS are tied to a separate read data line DR0 and source data line DL0, respectively. In addition, the storage transistor QS contains a second gate above the gate of the storage gate that is connected to a separate read word line WR0 and that forms a capacitance element CR between the read word line and the gate terminal NS.

The memory cell in this embodiment optionally uses a similar array structure to that in the first exemplary embodiment. Namely, it utilizes an open data line configuration to reduce the cell size, a differential sensing method in which a pair of data lines is input to a differential voltage sense amplifier SA constructed by a flip-flop pair of two N-channel and two P-channel transistors. The sense amplifier SA is separated from the data line by a P-channel and N-channel pair of pass transistors.

Figure 15:
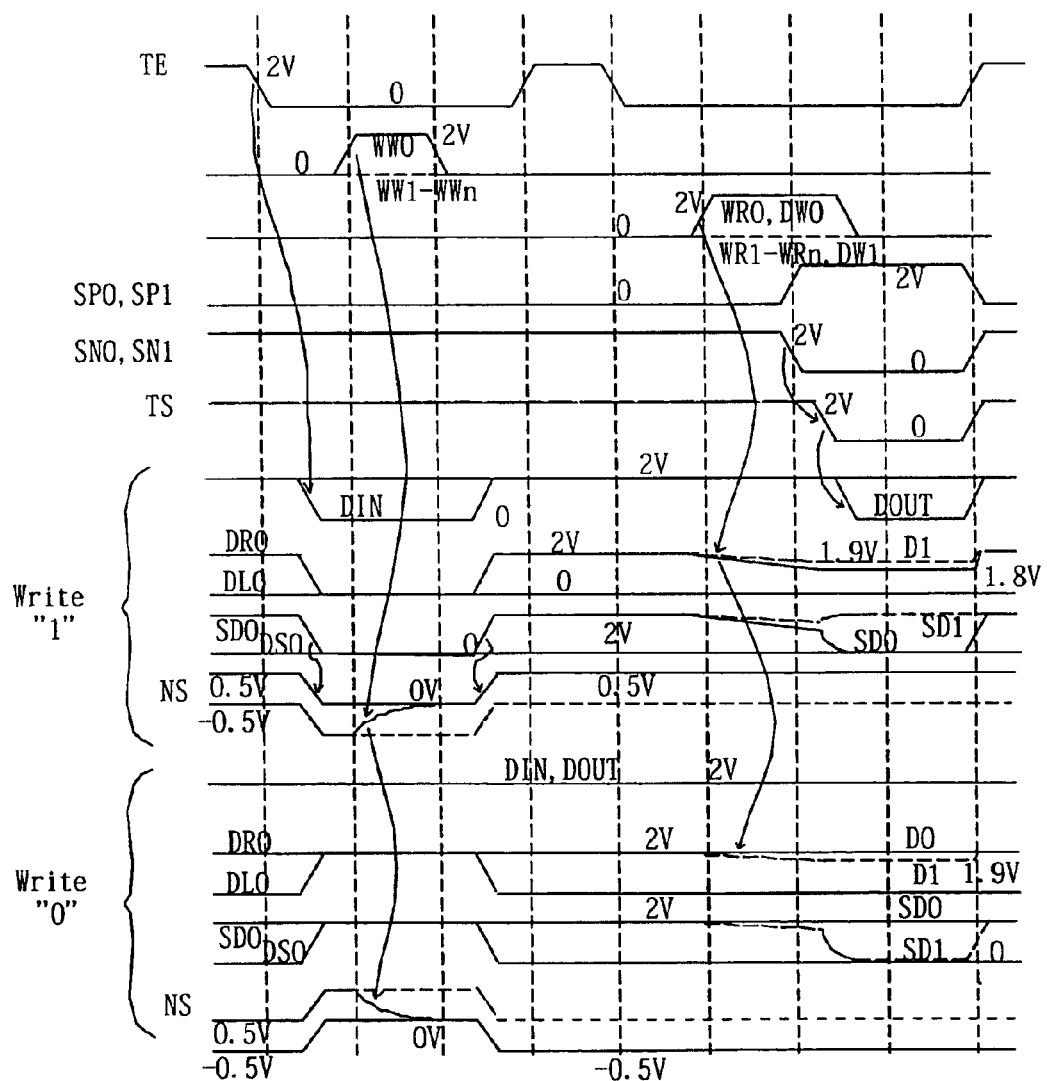
FIG. 15 shows the write and read access waveforms for a semiconductor memory.

The write operation follows a similar method to the capacitive coupling write method presented in the first embodiment. The procedure is described as follows and is illustrated in FIG. 15. During the standby state, the read data line DR0 is held at a high voltage level (2V) and the source data line DL is held at a low voltage level (0V). In order to write a low value, the read data line DR0 is held constant and the source data line DL is raised to a high value (2V). This operation is followed by an activation and deactivation of the write transistor QW by the write word line WW0 (0V) to equalize the storage node NS with the reference voltage TR. Finally, the source voltage is lowered to the low voltage level (0V) of the standby state. In this case, the storage node NS has an induced voltage of $(-V_s*C_s/C_{tot})$, where Vs, Cs, and Ctot are the change in voltage on the source line, the capacitance between the source line and the storage node, and the total capacitance of the storage node, respectively.

To write a high level (0V), the read data line DR0 is first lowered to a low voltage level while the source data line DL is held constant. After an equalization of the storage node NS to the reference node TR (0V), the write transistor QW is deactivated and the read data line DR0 is restored to the voltage of the standby state (2V). As the read data line DR0 is raised, a voltage is induced on the storage node NS according to $VR*CR/CTOT$, where VR, CR, and CTOT are the change in voltage on the read data line DR0, the capacitance between the read data line DR0 and the storage node NS, and the total capacitance of the storage node NS, respectively. A high value for VR and VS as well as a high ratio of CR to CTOT and CS to CTOT all contribute to a high signal margin on the store node.

A read operation comprises the raising of the voltage on the read word line WR0 (2V). Since there is a capacitive connection CR between the read word line WR0 and the storage node NS, a voltage will be induced on the storage node according to $VW*CW/CTOT$, where VW, CW, and CTOT are the change in voltage on the read word line WR0, the capacitance between the read word line WR0 and the storage node NS, and the capacitance of the storage node, respectively. Therefore, during a read operation, the voltage on the gate terminal of the storage transistor QS is given by $(-VS*CS+VW*CW)/CTOT$ and $(VR*CR+VW*CW)/CTOT$ for the low voltage data and high voltage data, respectively. Normally, the values are designed such that the voltage of the gate terminal only exceeds the threshold voltage Vt of the storage transistor QS when the read word line WR0 is activated. Therefore, only the cell currently accessed generates a current on read access.

This cell structure has the benefit of a smaller area versus the 3T type. In addition, cell area can be reduced relative to conventional 2T types since the input terminal to the write transistor QW can be shared between neighboring cells. Similarly, a non-boosted write word voltage can be used as in the first exemplary embodiment since the input voltage of the write transistor from the reference terminal TR can be kept at least one threshold voltage below the supply voltage. An additional note is that during the write operation, only one of the source or read data lines need be adjusted to operate a valid memory cell. In other words, the activation of the source data line during the write operation for the low signal can be omitted. Alternatively, the activation of the read data line during the read operation for the high signal can be omitted. If the source node is kept at a constant voltage, it is possible to share this data line between adjacent cells, further reducing the cell area.

In the memory cell according to this embodiment, the refresh scheme preferably is similar to the one used in the first exemplary embodiment (although it may be an alternative refresh scheme). The difference is that the source data line DL0 must also be activated along with the read data line DR0. The source data line driver uses the same circuit as the read data line, namely, a circuit that passes the signal from the DIN line to the SDL0 line and an inverted signal of the DIN line to the SDL0 line. Therefore, the output of the DOUT is fed into both the read data line driver and the source data line driver. This action sets both the source data line DL0 and the read data line DR0 to the same voltage during the rewrite portion of the refresh operation. In addition, P-channel transistors can act as the storage transistor QS, in which case the output signal DOUT must be inverted by an inverter circuit IE before being transmitted to the read data line DR0 and source data line DL0 drivers.

Figure 16:
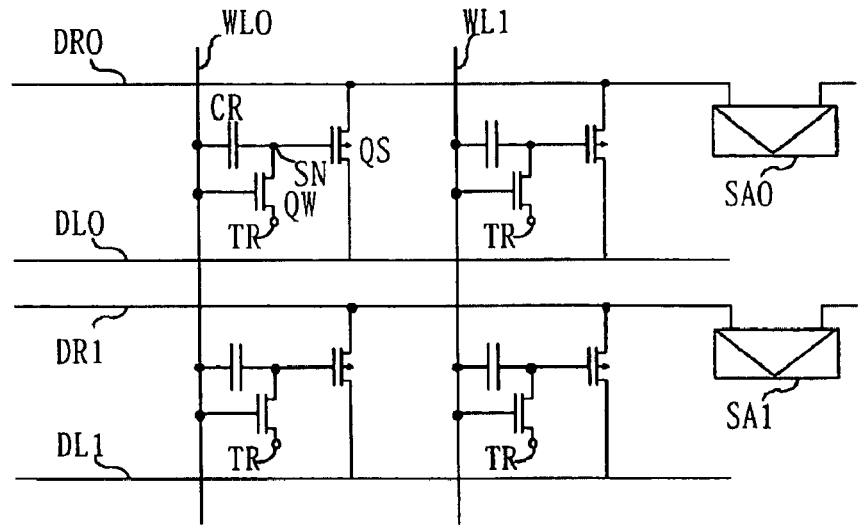
FIG. 16 is a circuit diagram for a semiconductor memory of a fourth exemplary embodiment.
Figure 17A:
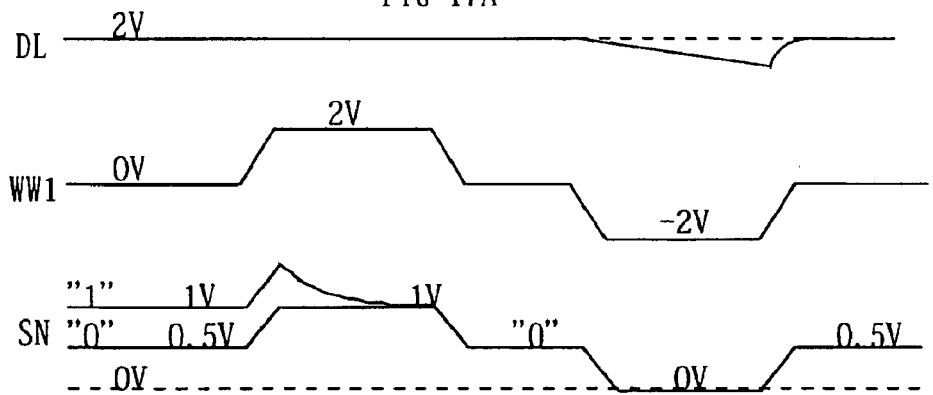
FIGS. 17A and 17B shows the write and read access waveforms for a semiconductor memory of a fourth exemplary embodiment.
Figure 17B:
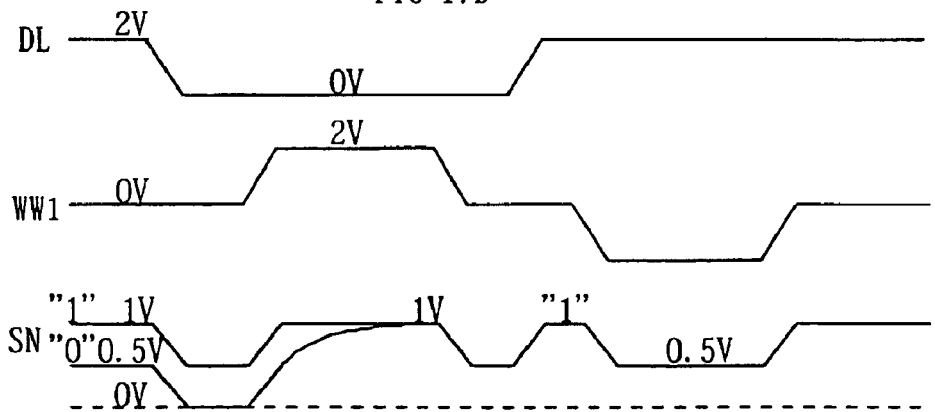

A fourth exemplary embodiment permits a memory with the same structure as used in the third embodiment as in FIG. 14 with a difference in that a single word line WL0 is connected to both the write transistor QW and the second gate CR of the storage transistor QS, as shown in FIG. 16. In addition, the channel type of the storage transistor QS is the opposite type of the write transistor QW. In this discussion, it is assumed that the write transistor QW is of the N-channel type and the storage transistor QS is of the P-channel type. However, this configuration could be reversed without altering the spirit of this embodiment. FIG. 17A and 17B show the access waveforms for the low data write operation and high data write operation, respectively. For simplicity of explanation, the voltage of the reference node TR is 1V, the capacitance of the second gate CR and the data line to storage node SN capacitance are both assumed to be one-quarter of the total storage node capacitance. In the standby state, the word line WL0 voltage is held at some middle value between the voltages necessary to activate either the write transistor QW or the read transistor QR.

A write operation begins with a similar read data line DR0 and source data line DL0 activation method as described in the third exemplary embodiment. After the read data line DR0 and source data line DL0 are set at appropriate voltages, the word line WL0 is raised to a high voltage that activates the write transistor QW and equalizes the storage node NS with the fixed voltage reference TR. Following word line W10 deactivation, the read and source data lines are returned to the standby state, storing a voltage value on the storage node NS. As in the third embodiment, the stored voltage in the high state is Vref+Vr*Cr/Ctot and the voltage of the low state is Vref−Vs*Cs/Ctot. The values are designed such that the low voltage state does not activate the storage transistor QS.

A read operation is started when the read data line DR0 is floated and the word line WL0 voltage is lowered. The change in voltage induced on the storage node is −Vw*Cw/Ctot. These values are designed such that the storage transistor QS enters the conduction region for at least one of the data values. At this point, a current will flow through the memory cell, causing a voltage change on the read data line DR0. After the data has been discriminated, the read operation ends with the raising of the word line WL0 voltage to the standby state.

In the memory cell MC according to this embodiment, the array structure, sense amplifier SA, and refresh scheme are all preferably similar to the 2T structure of the third exemplary embodiment. This memory array achieves a small area size due to the use of a single word line per cell.

Figure 18:
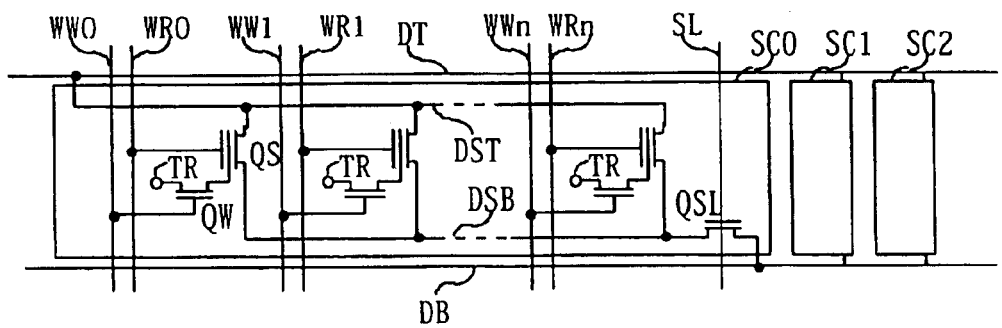
FIG. 18 is a circuit diagram for a semiconductor memory of a fifth exemplary embodiment.

A fifth exemplary embodiment permits a memory as shown in FIG. 18 in which the storage transistors QS in a series of 2T memory cells are connected in a parallel fashion and employing the capacitive coupling write technique as presented in the first embodiment. The cell structure is similar to the memory cell in the third embodiment in that there is a write transistor QW connected to the gate electrode of a storage transistor QS and a fixed voltage reference TR. Similarly, the storage transistor QS has a second gate fixed about the first gate that is used to activate the cell when the read word line WR0 is raised. The primary difference between this memory and that of the third exemplary embodiment is that for a subset MC0 of the cells in a column, the source terminal of each storage transistor QS is connected to a sub-source data line DSB. This sub-source data line is in turn connected to the main source data line DB through a sub-column access transistor QSL when the select line SL is activated.

Figure 19A:
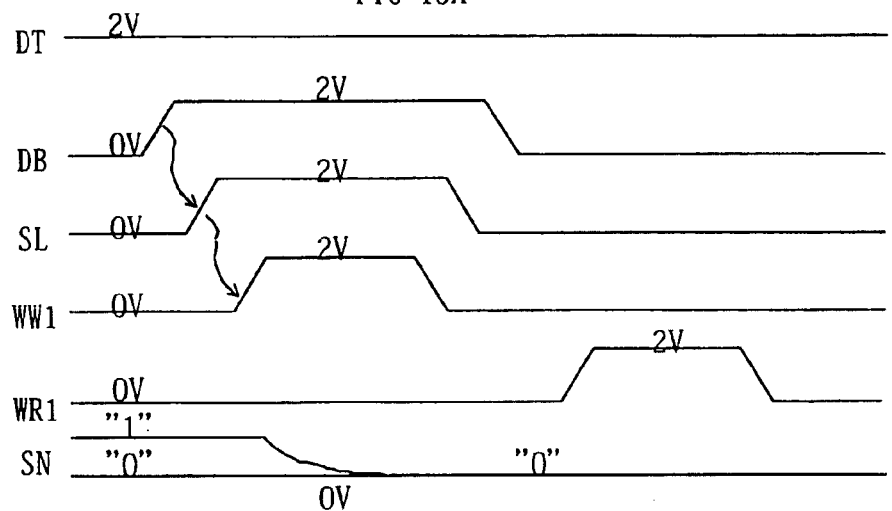
FIGS. 19A and 19B shows the write and read access waveforms for a semiconductor memory.
Figure 19B:
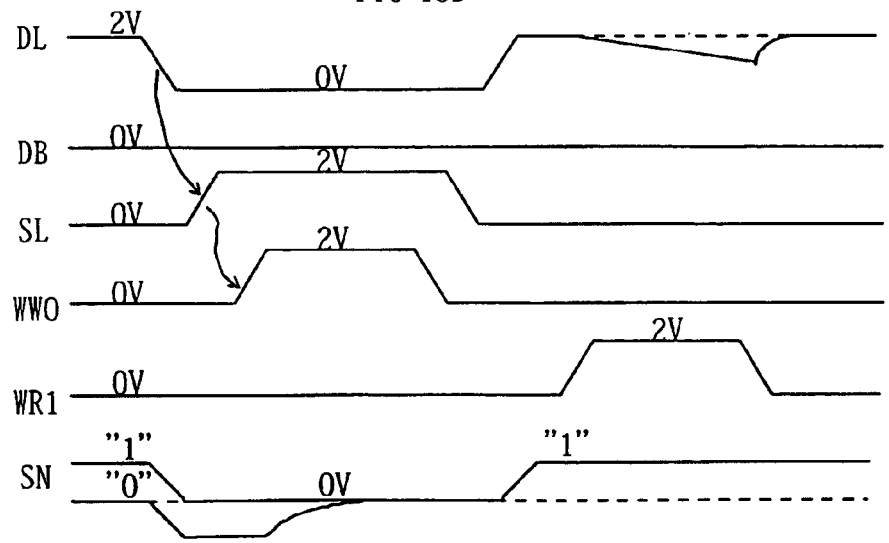

The write operation is identical to that of the first embodiment and the waveforms are shown in FIGS. 19A and 19B. To summarize, the voltage of the read data line is set to a value of the opposite polarity of the write bit and the data is set after the read data line is restored to the standby voltage. The read operation is similar to the third embodiment in that a read word line WR0 is set at a voltage (2V) that activates the storage transistor QS through the second gate connection. In addition, the sub-column access transistor QSL is also activated by the select line SL0 to enable a current path through the memory cell. This cell achieves the small size of the 2T cell with a minimal increase due to the sub-column access transistor QSL. However, this cell overcomes a possible large leakage current in the normal 2T memory by effectively reducing the number of cells connected to the read data-line during the read operation. This results in a faster read time since the current from the unselected cells is drastically reduced.

This memory utilizes the same open data line structure, the same differential voltage sense amplifier SA, a dummy cell concept, and a similar refresh operation as that presented in the first embodiment. However, the peripheral circuits and methods presented in the second embodiment (or others) can also be employed if the circumstances warrant. In addition, N-channel devices can be substituted for P-channel devices in the storage transistor QS if it is deemed that the coupling effects from other nodes in the circuit prohibit the storage transistor from entering the conduction region. Similarly, the sub-column access transistor and cell write transistor may be substituted by P-channel devices and reverse polarity access signals.

Figure 20:
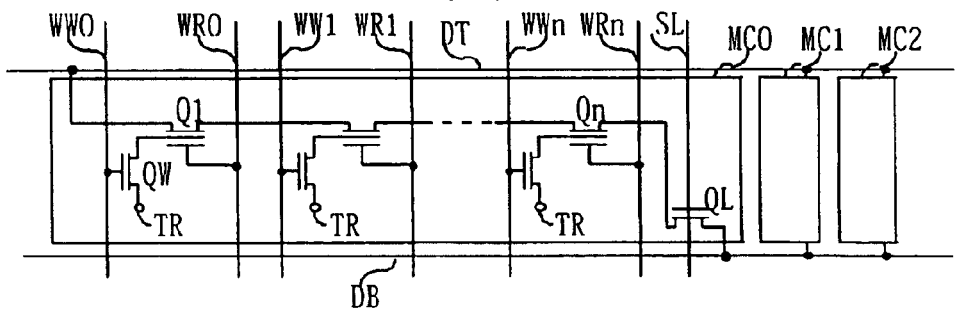
FIG. 20 is a circuit diagram for a semiconductor memory of a sixth exemplary embodiment.

A sixth exemplary embodiment describes a memory as shown in FIG. 20 in which the storage transistors QS of a series of 2T memory cells are connected in a series fashion employing the capacitive coupling write technique as presented in the first embodiment. The cell structure is preferably similar to the structure presented in the third embodiment. In this memory the storage transistors QS in a sub-column MC0 are connected in a series configuration with the drain of one storage transistor connected to the source of the next storage transistor in the series. In addition, each storage transistor QS has a second gate connected to a read word line WR0 as in the third embodiment. A write transistor QW connects the storage gate to a fixed voltage reference TR. Each sub-column is connected to the main source data line DB through an access transistor QL, which is connected to the first storage transistor QSn in the sub-column series.

Figure 21A:
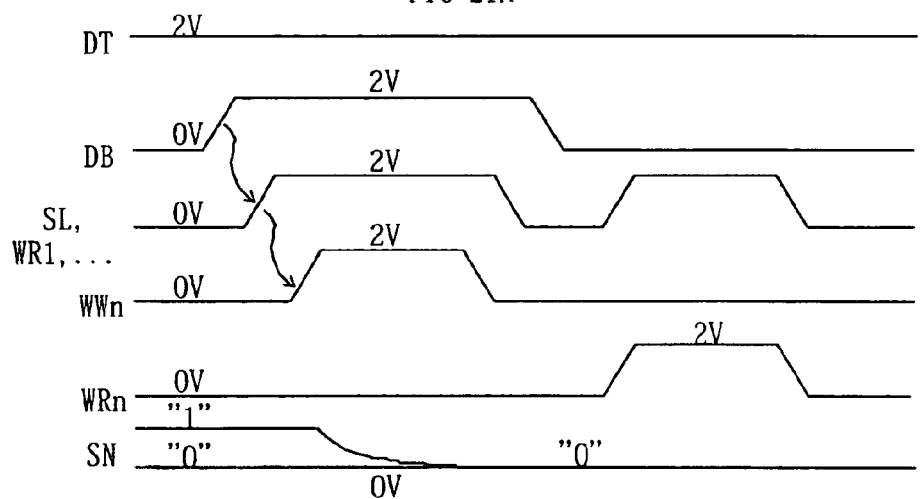
FIGS. 21A and 21B shows the write and read access waveforms for a semiconductor memory of a sixth exemplary embodiment.
Figure 21B:
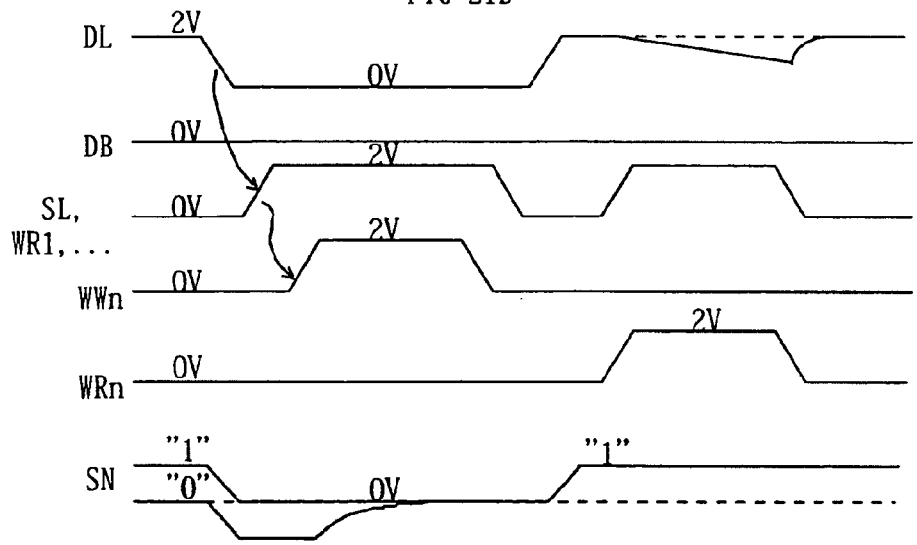

A write operation is described below and the waveforms are shown in FIGS. 21A and 21B. In this case, it is assumed that the storage node NS of store transistor QSn is written. However, this technique can apply to any storage transistor in the sub-column series. Initially, a voltage is presented on the read data line DT as designated for the capacitive coupling method, a low voltage on the data line to write a high voltage on the storage node and a high voltage on the data line to write a low voltage on the storage node. The read word lines of all of the cells in the sub-column with the exception of the read word line of the cell currently accessed (WRn) are set to a voltage that puts the associated storage transistor in the conduction region regardless of the voltage on the storage node. In addition, the access transistor QL to the sub-column is activated by the select line SL (2V). In this manner, the source and drain terminal of the currently accessed storage transistor QSn will be roughly at the voltage of the source data line and the read data line, respectively. The write word line of the accessed cell (WWn) is activated and then deactivated to equalize the storage node voltage with the fixed voltage reference. Following this operation, the source data line and read data line are returned to the standby voltage state. This action adjusts the voltage on the storage node of the accessed storage transistor through the capacitive coupling from the gate-source and gate-drain capacitance of the storage transistor QSn. In this manner, a data value can be stored in a cell.

The read method involves raising the read word lines of the cells in the sub-column that are not being accessed to a point where the transistor is in the conduction region regardless of the data being stored. In addition, the sub-column access transistor QL is activated to provide a current path through the sub-column. The read word line of the accessed cell (WRn) is set to a voltage in which the conduction of the storage transistor QSn depends on the data stored. For a high voltage on the storage node, a higher current will pass through the accessed transistor than for the low voltage data. This current will produce a voltage change on the data line that can be sensed by a voltage sense amplifier SA connected to the read data line, thus discriminating the value stored in the accessed cell.

The memory described in this embodiment is organized in the open data line configuration, utilizes a differential voltage sense amplifier, contains a refresh circuit method, and a dummy cell technique that were all presented in the first embodiment (or alternative devices). In addition, the N-channel transistors may be substituted by P-channel transistors as the storage transistors QS if the N-channel devices fail to enter the conduction region under the normal operation presented above. This technique achieves a smaller cell area than the parallel connection type of the sixth exemplary embodiment due to the elimination of the drain and source contacts for the storage transistors. However, the access speed will be degraded due to the series resistance of the sub-column current path.

Figure 22:
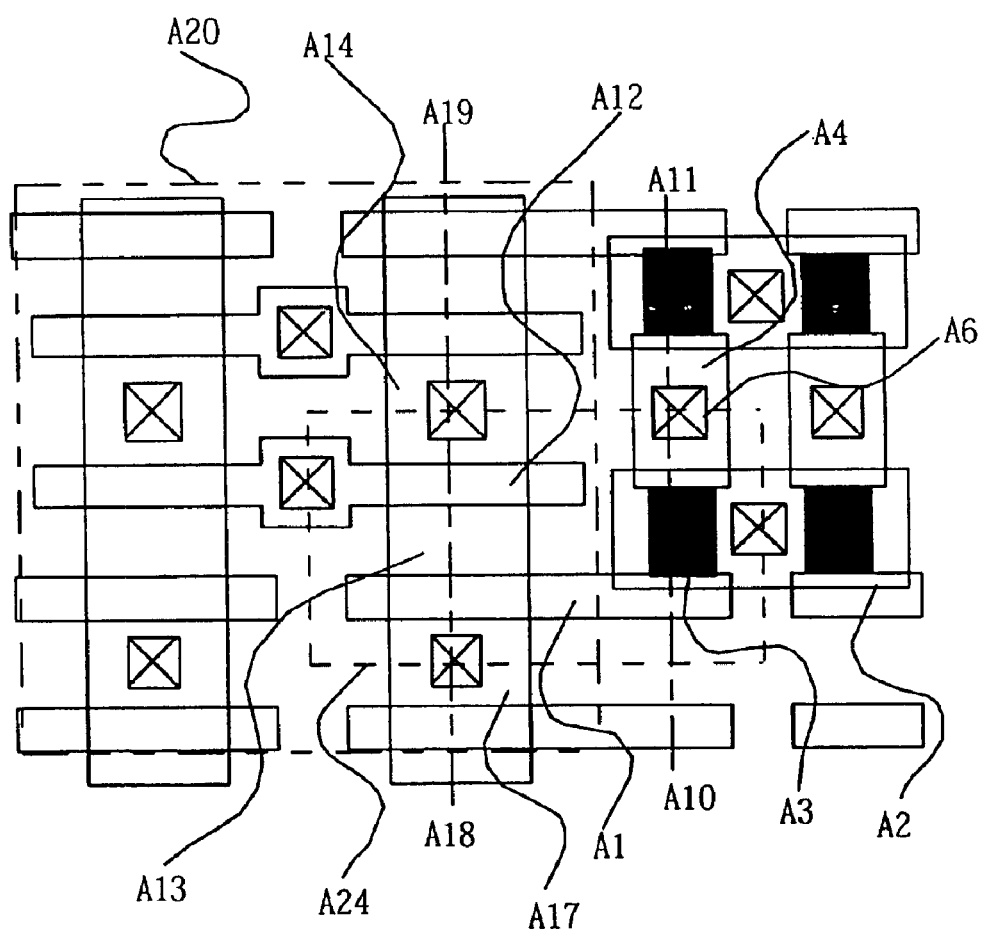
FIG. 22 shows a layout pattern for the semiconductor memory array of a seventh exemplary embodiment.
Figure 23:
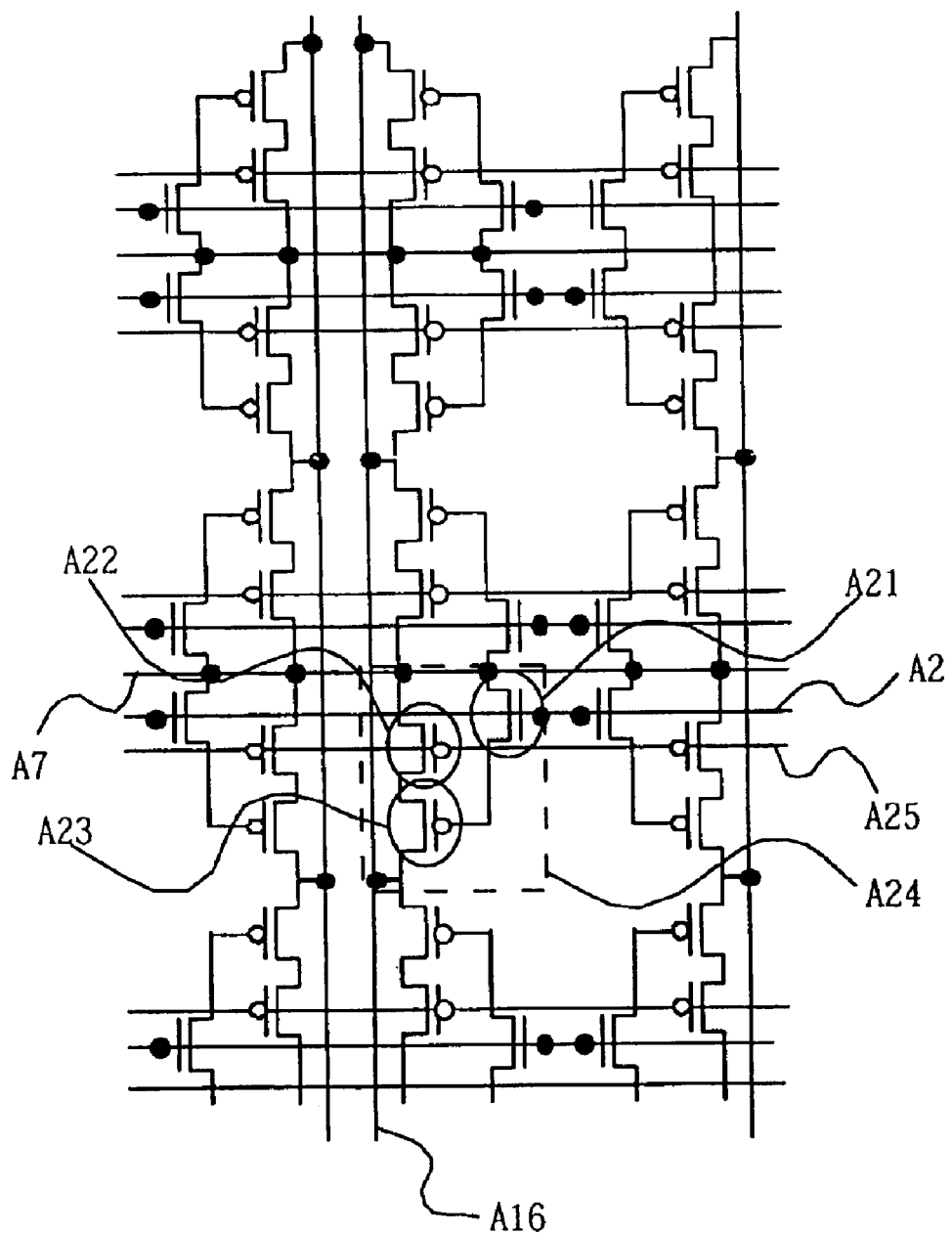
FIG. 23 is a schematic view for a semiconductor memory array.
Figure 24:
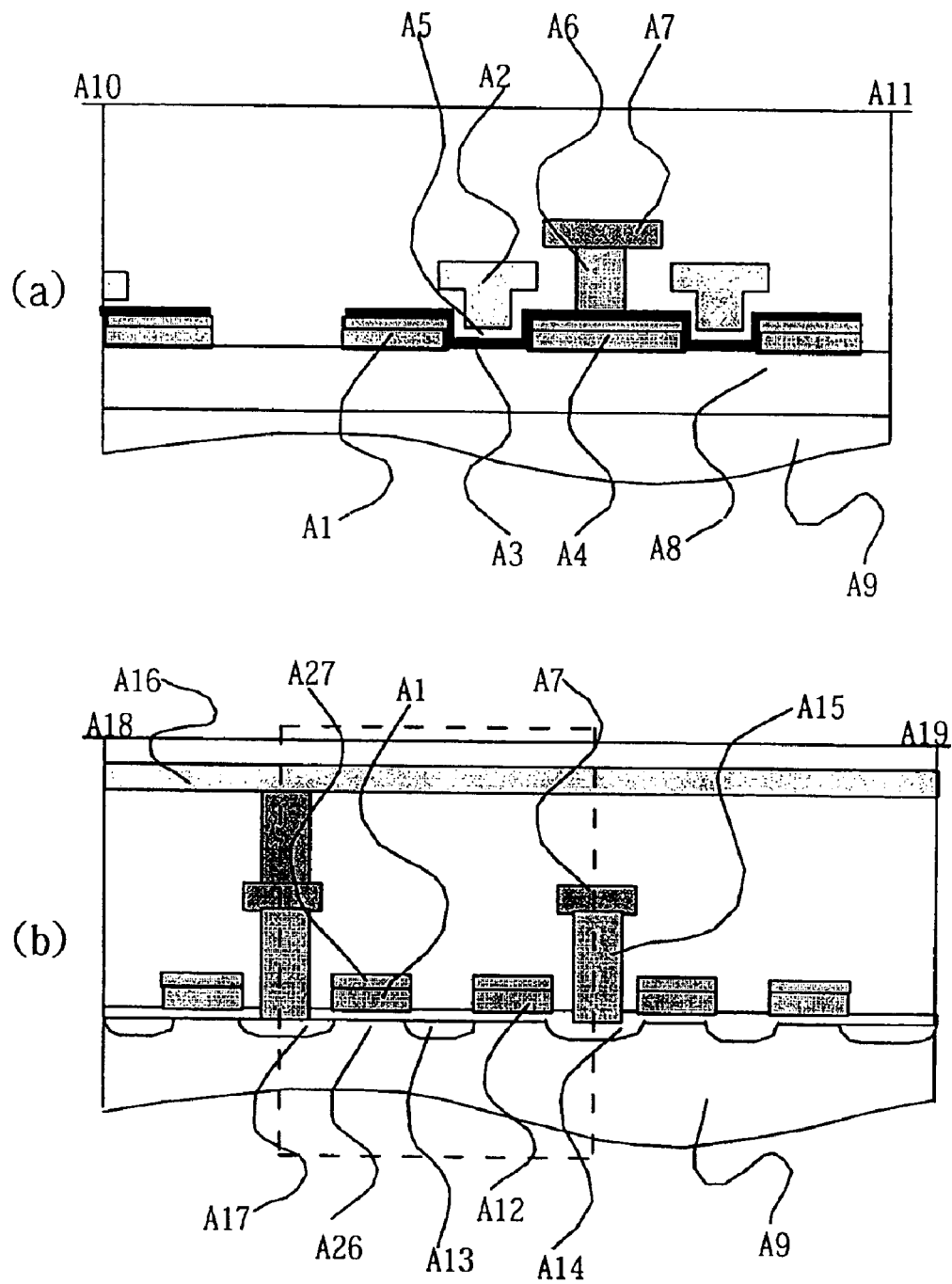
FIG. 24A and 24B are cross-sectional views of a semiconductor memory array structure of a seventh exemplary embodiment.
Figure 25:
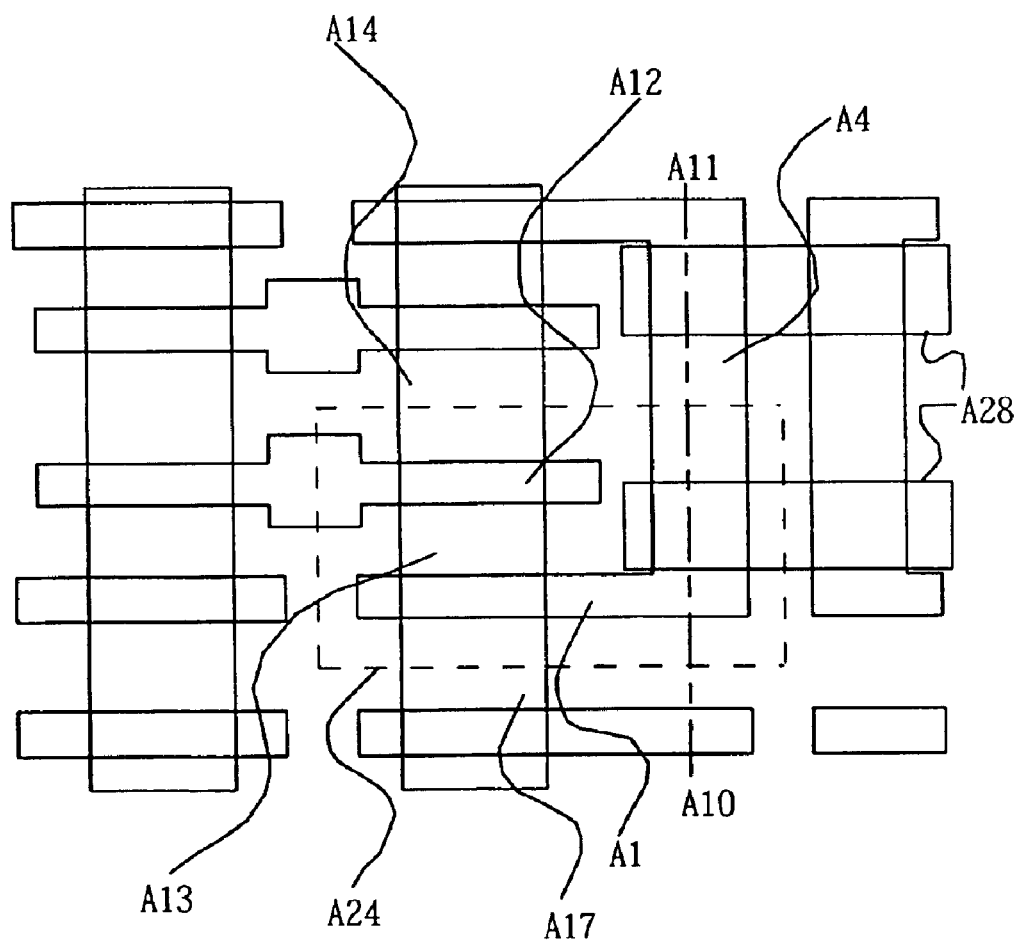
FIG. 25 shows a layout pattern for a semiconductor memory array.

A seventh exemplary embodiment permits a memory shown in FIGS. 22 to 25 that utilizes a thin-channel transistor in the 3T configuration described in the first embodiment. FIG. 22 shows the layout of a single cell A24 surrounded by other cells in an array configuration. For the purposes of clarity, only the layers up to the contact layer for metal routing are shown in FIG. 22. The data lines A16 run in the vertical direction on the second metal layer, and the common source lines A7 are arranged in the horizontal direction on the first metal layer. FIG. 23 shows 15 cells arranged in a 3×5 balanced circuit array, with a unit cell A24 defined by the dotted line. FIG. 24(a) shows the cross sectional view between A10 and A11, and FIG. 24(b) shows the cross sectional view between A18 and A19. In addition, the layout pattern shown in FIG. 25 is a reduced set of masks for the same pattern in 22 in order to supplement the illustration of the fabrication process for the memory array in this embodiment.

The memory provided by this embodiment preferably comprises a three transistor structure A21, A22, A23 arranged with the same connection relation as the memory cell in the first embodiment. A feature of this memory is that the write transistor is fabricated above the insulation layer A8. The N-channel write transistor is preferably made up of 150 nm thick silicided surface N-type polysilicon source A1 and drain A4 regions and a 2 nm thick intrinsic silicon channel region A3. P-type polysilicon is used for the gate terminal A2 to adjust the threshold voltage of the write transistor. The N-channel read and store transistors A12 are formed from N-type diffusions in a P-type well region and utilize N-type polysilicon gate electrodes.

A feature of the memory cell presented in this embodiment is the thin-channel polysilicon transistor. A conventional memory cell employs a conventional write transistor to transfer a charge to a storage node and then sustain this charge after the write transistor is deactivated. However, this charge is not maintained indefinitely since the transistor exhibits a leakage current due to several sources, for example the subthreshold leakage from the source to the drain or junction leakage from the source or drain to the bulk region. In a standard CMOS process, this is normally on the order of $10^{-14}$ to $10^{-13}$ A. For a retention time of several tens of milliseconds, normally a capacitance element of 20–30 fF is required at each storage node. In this embodiment, we present a memory using a thin-channel polysilicon transistor.

Normally, polysilicon film transistors exhibit higher leakage currents than conventional transistors.

Therefore, using a normal polysilicon transistor would decrease the retention time of a memory cell. However, using the structure and processing steps for the thin-channel transistor presented in later embodiments of this invention, a thin-channel transistor with a much lower leakage current than conventional bulk or polysilicon transistors may be used in this invention.

In detail, by fabricating a channel with a thickness on the order of 2 nm that connects to the drain and source regions, subthreshold leakage currents can be reduced to $10^{-18}$ A. Additionally, since this device is fabricated above the insulation layer, junction leakage is reduced to about 0A. The low leakage characteristic of this device is the result of a quantum confinement effect resulting from the thin junction connection and channel width that effectively widens the bandgap for the device. One option to enhance this memory is to use a material with a wide band gap to further reduce the leakage current. For example, SiGe can achieve a similar leakage to Si even for a wide channel thickness. By using the thin-channel polysilicon transistor, a charge can be stored for much longer time periods, perhaps several minutes, using only the gate capacitance of a standard transistor as the storage capacitance. This allows a much simpler fabrication process since no complex capacitor structures or expensive materials are required. In addition, since a transistor provides a gain, storing a charge on the gate of the transistor allows a larger output signal and non-destructive read operation, increasing the speed of the read operation.

The fabrication process for the memory according to this embodiment is now presented. Using a P-type SOI silicon wafer, after a sacrificial oxidation step, a SiN layer is accumulated. A photoresist pattern is made over the regions that are to be open for the P-type well regions and the SiN layer is etched. Immediately following this step, Boron ion implantation occurs, the resist is cleaned, and an oxidation step is performed. In this step, the area covered by SiN is relatively unaffected by the oxidation process. After removing the SiN, a P (Phosphorous) ion implantation is performed. However, the area covered by the previous oxidation step is unaffected by this implantation. An activating annealing step is performed and all oxidation is removed, exposing the Nwell (A9) and Pwell regions. Although this process assumes the use of a SOI wafer due to the various voltages to be utilized, this can be easily adapted so that additional P well regions may be formed within an N well region, achieving a so-called "triple-well" structure in order to accommodate the various voltage levels necessary for this memory.

After the element separation regions are formed, several ion implantation steps are performed to adjust the threshold voltage of the devices by appropriate photoresist masks, followed by a gate oxidation step. In order to accommodate the various voltage levels, the gate thickness can be set to one of two or more levels. In this exemplary embodiment, a 5 nm thickness $SiO_2$ gate is used in the memory cell. Following this oxidation step, an intrinsic polysilicon layer is deposited. Using a masked resist, the N-type transistor regions are implanted with an N-type dopant and the P-type transistor regions are implanted with a P-type dopant. In addition, although the write transistor is located above an N-type well region, the polysilicon region is implanted with an N-type dopant. After the resist is removed, a diffusion and active annealing process is performed. The polysilicon is silicided to reduce wiring resistance and the mask for the gate region is patterned. The mask pattern A24 is preferably not used in this embodiment.

At this point, the source A6 and drain A1 regions of the write transistor are composed of the same a layer of N-type polysilicon. A resist mask is patterned for the extension region formations in which As is implanted into the N-type transistor and BF2 is implanted in the P-type transistor. After the resist is removed, $SiO_2$ or SiN is deposited and etching is performed to create a sidewall on the gate. A resist is patterned, P is implanted into the N-type transistor regions, and BF2 is implanted in the P-type transistor regions, thereby forming the high concentration diffusion regions. After a 10 nm thick $SiO_2$ layer deposition, a resist pattern (A28) is used to etch $SiO_2$ and N-type polysilicon regions. As a result, the write transistor source and drain regions are separated and the sidewalls of both regions are exposed. The resist is removed, the wafer is cleaned, and a 2 nm thick layer of amorphous silicon is deposited. After depositing an additional 5 nm layer of $SiO_2$, a resist pattern is formed protecting the channel region of the write transistor and the $SiO_2$ layer is wet etched with HF. The resist layer is removed and the wafer is oxidized with $O_2$ plasma in order to ensure a weak oxidation process. The remaining 5 nm thick $SiO_2$ layer is relatively unaffected by this process. As a result, the channel region of the write transistor is formed. An additional 5 nm layer of $Si_2$ is deposited followed by a deposition of an N-type doped layer of polysilicon. This layer is patterned and etched to form the gate region of the write transistor. Finally, an insulation layer is deposited, allowing the subsequent contact and interconnect layers to be fabricated.

An eighth exemplary embodiment permits a memory utilizing a three transistor memory cell as defined in the seventh embodiment and defined by the same FIGS. 22 to 25. The transistors and array are arranged with the same connection relation as the memory cell in the first embodiment. The unique feature of this memory is that the write transistor A21 is an N-channel thin-channel transistor as described in the seventh exemplary embodiment and the storage transistor A23 and the read transistor A22 are P-channel transistors. The P-channel read and store transistors A12 are formed from P-type diffusions in an N-type well region and utilize P-type polysilicon gate electrodes.

As explained above in reference to the first embodiment, by using opposite type transistors for the write A21 and store A23 transistors, the operation margin of the memory can be increased. In that this memory uses a thin channel polysilicon transistor as the write transistor, by the same effect that limits the subthreshold leakage currents, the "on" current in the write cycle is also limited. Therefore, an N-channel device is chosen since typically N-channel transistors have a higher mobility than P-channel transistors, speeding up the write process. Therefore, the storage transistor is chosen as a P-channel device to afford the widest voltage margin as explained earlier. On the other hand, since it is possible to include a memory buffer that stores data before it is written to a memory cell, a slow memory cell write operation may not affect memory performance. However, memory read access cycles cannot be delayed in the same way. For this reason, if the read process is deemed too slow, an N-channel storage transistor and P-channel write transistor may be utilized.

It is conventional for an N-channel transistor to employ an N-type gate electrode and for a P-channel transistor to employ a P-type gate electrode. Therefore, in the memory cell used in this embodiment, the P-type gate of the storage transistor cannot directly be used as the N-type source or drain region of the write transistor. However, for this embodiment, a method is proposed in which the same body of polysilicon can be used for the gate of the storage transistor and the drain or source of the write transistor. A masking pattern A20 is included in the process that encompasses the active region of the P-channel transistors. Using this masking, a P-type dopant (i.e., $BF_2$) is implanted into the regions that will form the gate electrodes of the read and store transistors. Using an inverse of this mask, an N-type dopant (i.e., As) is implanted into the region that will form the source and drain region for the write transistor. In the conventional case, since a PN junction region is formed by this operation, this fabrication is usually avoided. However, by siliciding the surface of the polysilicon, a metallized connection is formed between the N-type and P-type regions, allowing the junction effect to be neglected.

An additional method is to fabricate physically separated N-type and P-type polysilicon parts and then connect the two through a contact to a metal interconnect layer. The advantage of using a single polysilicon connection is that the memory cell area can be reduced versus using an interconnect layer to connect the separate parts. In addition, if the doping concentration of the impurities in the N-type and P-type region is high enough, the junction effect can be ignored. In effect, with a high impurity concentration, the junction region is reduced and a tunneling current may flow between the N-type and P-type regions. For this phenomenon to occur, a doping concentration of $10^{20}$ is desired for both regions. Another important effect is that if the gate region of the storage transistor is raised to a sufficiently high voltage, the PN junction becomes forward biased, reducing the resistance caused by the junction. On the other hand, this junction resistance may further reduce the leakage rate of the storage node, enabling a longer retention time of the data.

The fabrication process for the memory permitted in this embodiment has been presented in the seventh exemplary embodiment. The difference is the addition of the mask layer A24 to dope the polysilicon with P-type dopants for the areas that act as gates of the P-type devices and with N-type dopants for the areas that are the drain and source regions of the polysilicon device as described above. This step occurs after the polysilicon layer has been deposited. A silicidation step is included to reduce the resistance of the polysilicon as described above.

The memory presented in this embodiment can also be arranged and activated according to the first exemplary embodiment. In summary, this memory can be fabricated in an open data line configuration, employ a differential voltage sense amplifier to discriminate the signal, use a dummy cell to generate a reference signal, and utilize a refresh operation in which data is read, inverted, and then rewritten back to the accessed data cell according to the first embodiment.

Figure 26:
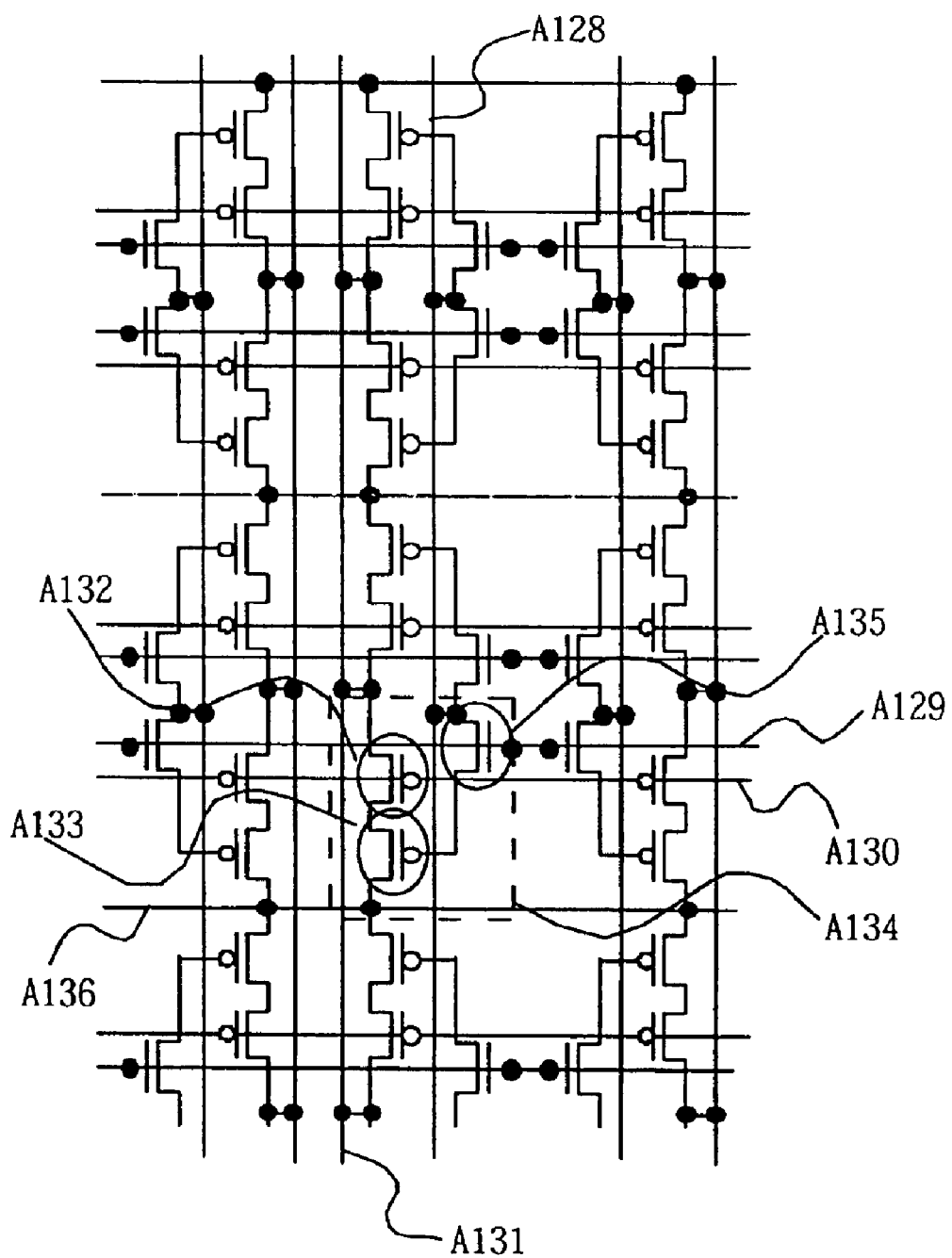
FIG. 26 is a schematic view for a semiconductor memory array of a ninth exemplary embodiment.

A ninth exemplary embodiment describes a memory utilizing a thin-channel transistor as described in the seventh embodiment in a conventional 3T memory cell configuration. The schematic representation of this cell is shown in FIG. 26, with a unit cell A134 that comprises a store transistor A133 with one node connected to the source line A136, a read transistor A132 connected to the read data line A131 and the storage transistor A133, and a write transistor A135 connecting a write data line A128 to the gate of the storage transistor, with the difference being that the write transistor has a thin channel region less than or equal to 5 nm deep. The difference between this memory configuration and the one presented in the above seventh embodiment is that the drain of the thin-channel write transistor that is not connected to the storage node is connected to a separate write data line A128 as opposed to the source of the read transistor. This memory is unique from a conventional 3T cell due to the use of the thin-channel transistor as the write element, allowing a much longer retention time than a standard write transistor as explained in the seventh embodiment.

The read and write access method for the memory of the current embodiment are from the conventional 3T cell structure described in the first embodiment and were illustrated in the waveform plots of FIGS. 6A and 6B. To write a high voltage during the write period in FIG. 6B, the write data line is charged to Vdd. In order to transfer the full voltage level of Vdd to the storage node, a boosted voltage is presented to the write word line of Vdd+Vt. The write transistor is thus activated, transferring a charge that equalizes the storage node voltage with the write data line. After the high voltage is set on the storage node, the write word line is deactivated, and the memory cell is in the standby state with a stored voltage of Vdd. To store a low voltage on the storage node during the write period of FIG. 6A, the write data line is charged to 0V. The write transistor is activated by the boosted voltage write word line. After the write transistor is deactivated, the device is in the standby state with a stored voltage of 0V.

The read cycle follows the same procedure as the memory cell in the second embodiment in which the read transistor is activated by the read word line and a current flows through the memory cell. The voltage on the storage node alters the conduction of the N-channel storage transistor, causing a faster decrease in the data line voltage for the high value state. The read state ends when a sufficient voltage change is developed on the data line to determine the value of the data in the memory cell and the read transistor is deactivated.

The memory exhibited by this embodiment preferably uses an open data line configuration, a differential sense amplifier circuit, and a dummy cell scheme as described in the first embodiment. The refresh scheme in this embodiment is distinct from that of the first embodiment since the voltage on the storage node after a write operation is directly proportional to the voltage on the data line during the write operation. Therefore, an inversion circuit is needed to invert the output of the amplifier. This signal is input into the input data buffer and a write operation is conducted to fully refresh the data of the accessed cell.

Figure 27:
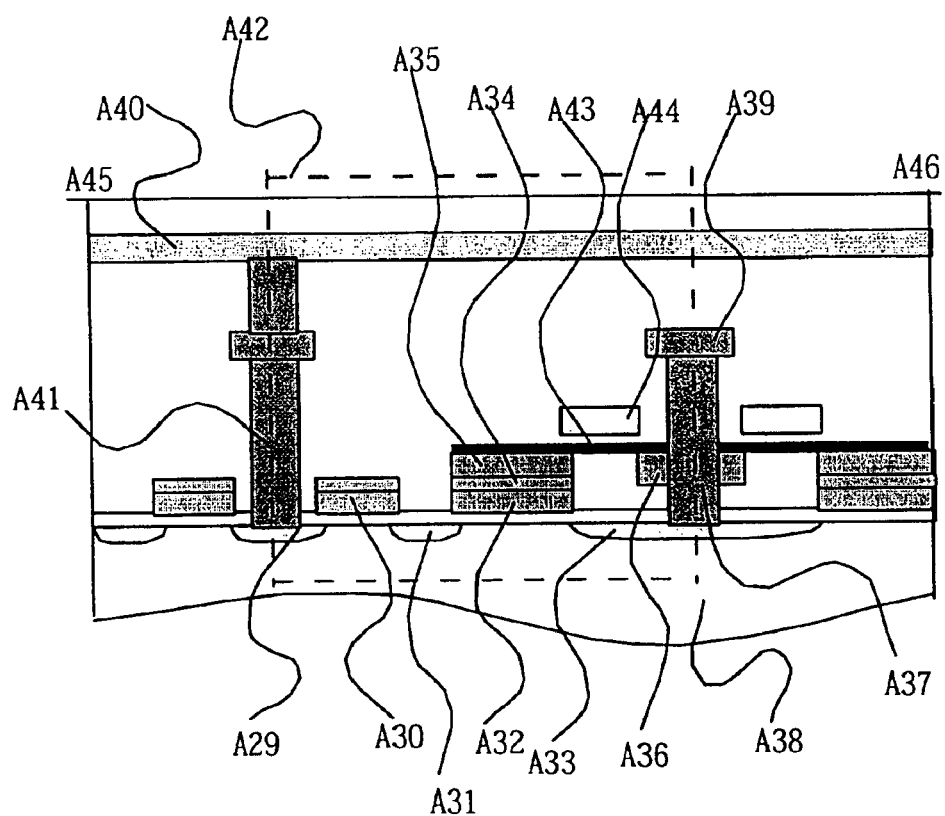
FIG. 27 is a cross-sectional view of a semiconductor memory array structure of a tenth exemplary embodiment.
Figure 28:
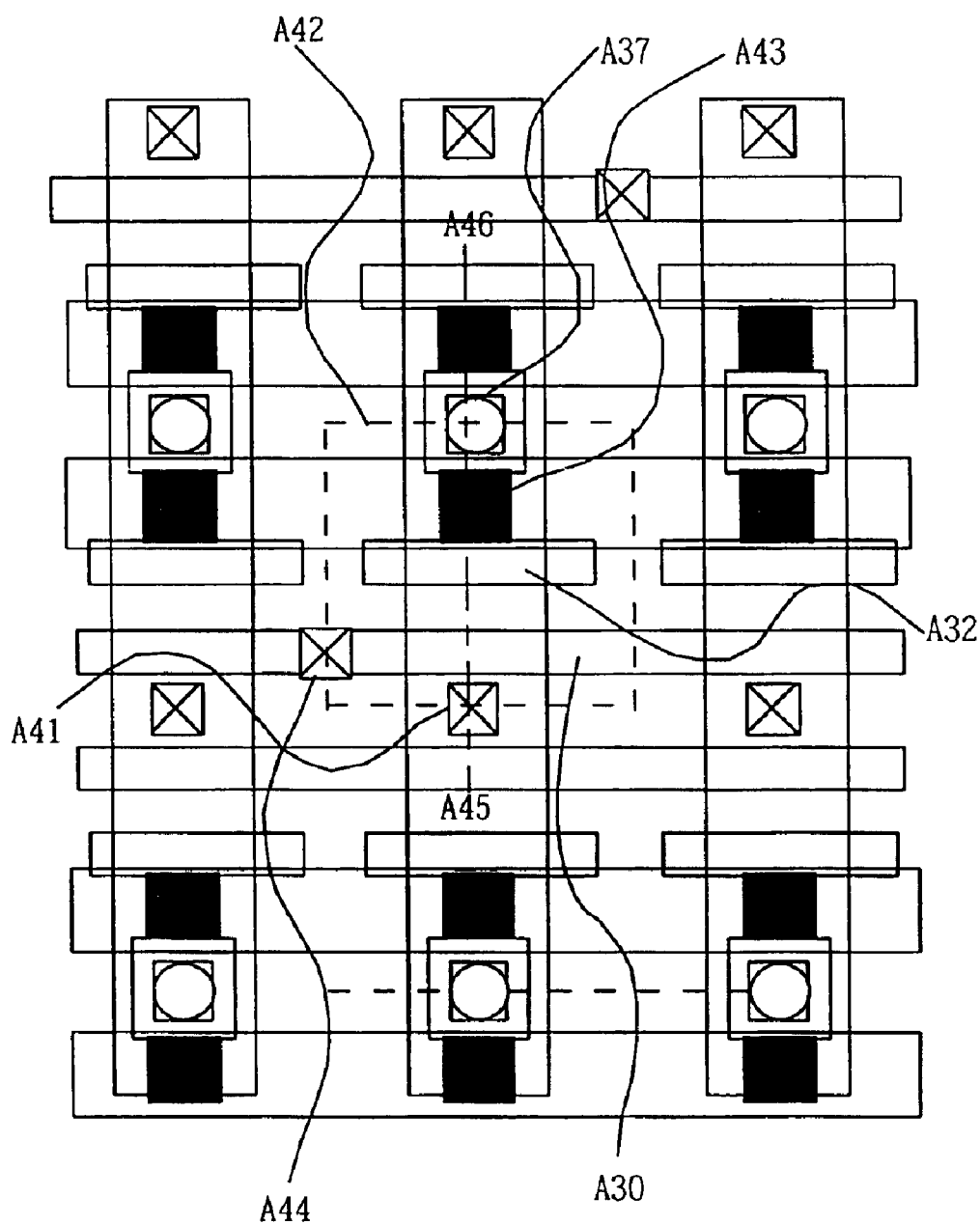
FIG. 28 shows a layout pattern for a semiconductor memory array.
Figure 29:
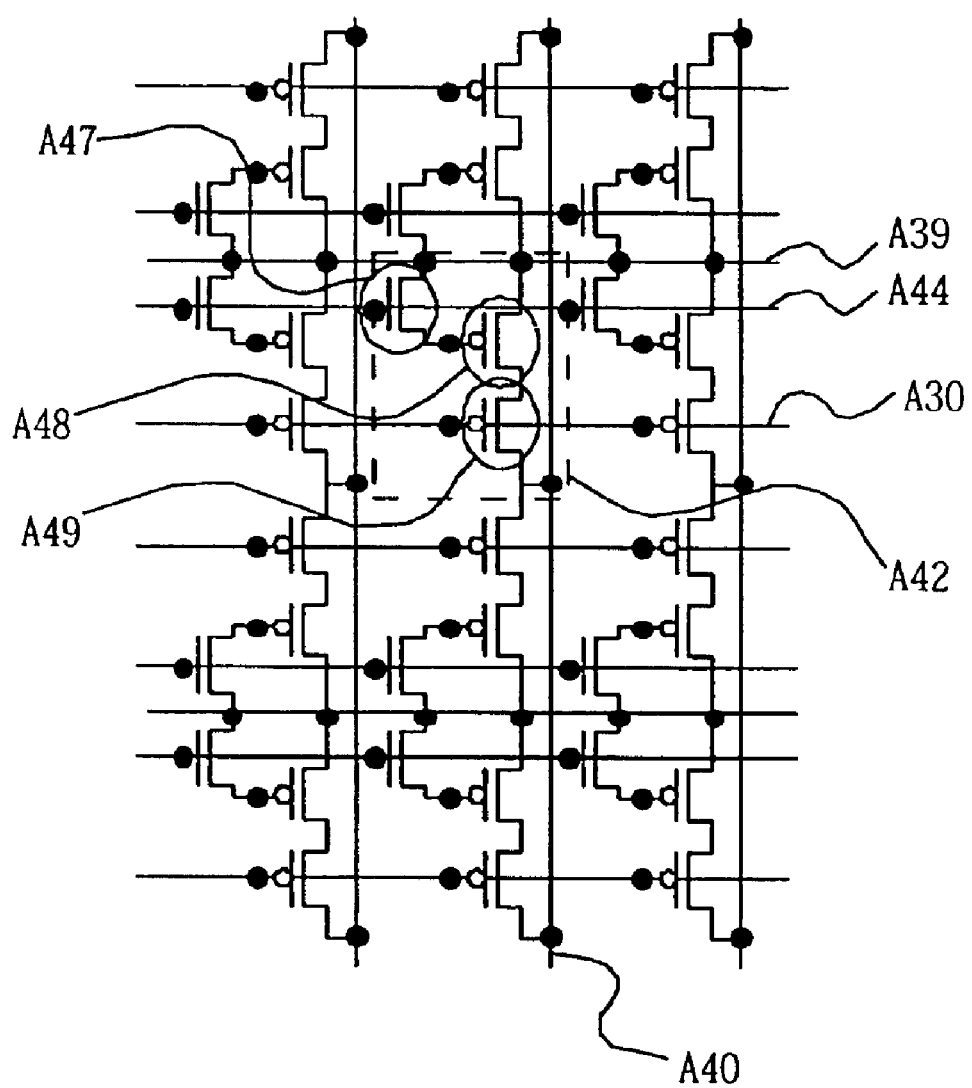
FIG. 29 is a schematic view for the semiconductor memory array.

A tenth exemplary embodiment permits a memory as detailed in FIGS. 27 to 29 that is arranged in a three transistor configuration according to the first embodiment. FIG. 28 shows the unit cell layout (A42) with surrounding cells in an array configuration. Nine full cells are shown in a 3×3 configuration along with adjacent parts of the surrounding cells. For the purpose of clarity, the patterns from the interconnect layers have been omitted. FIG. 29 shows a 3×4 balanced cell array layout with a unit cell (A42) indicated by a dotted line. FIG. 27 shows the cross section between points A45 and A46 on FIG. 28.

The memory provided in this embodiment incorporates an N-type polysilicon write transistor A47 and a P-type storage transistor A48 as in the previous embodiment. However, the positional relationship between the storage transistor A48 and the read transistor A49 is altered in this embodiment such that beneath the gate of the storage transistor A48, a vertically stacked structure of P-type polysilicon, metal, and N-type polysilicon is formed in order to reduce the cell area. In order to make the connection between the gate of the storage transistor with the polysilicon layer above it, a layer of metal is deposited directly above the P-type polysilicon gate, followed by a direct connection with an N-type layer above this. Another method is to use a silicidation process in place of the metal deposition.

One exemplary fabrication process for the memory in this embodiment is derived from that of the seventh embodiment, and only the differences will be explained. Initially, the transistors are fabricated on an SOI wafer as described in the seventh embodiment, and an insulation layer is deposited. Following this step, a planarization process exposes the upper surface of the gate region on the P-channel devices. If the fabrication process is according to that of the seventh embodiment, the N-well region is higher than the P-well region so the gates of the NMOS devices are not exposed. After depositing a layer of N-type polysilicon, the source A35 and drain regions A36 of the write transistor are patterned and etched. Then, an insulation layer is deposited, followed by a planarization step that exposes the upper surface of the N-type polysilicon.

At this point, a 3 nm thickness layer of amorphous silicon and a 5 nm thickness layer of $Si_2$ are preferably deposited, patterned, and etched to form the channel A43 of the write transistor. A 5 nm thickness layer of $SiO_2$ is deposited followed by a layer of N-type polysilicon and a layer of W. This is patterned and etched to form the gate region of the write transistor and the write transistor word line A44. A feature is the use of a contact A37 that penetrates the write transistor source region A36. In this manner, the write transistor source region A36 and the storage transistor source region A33 are simultaneously electrically connected to the source line A39.

Figure 30:
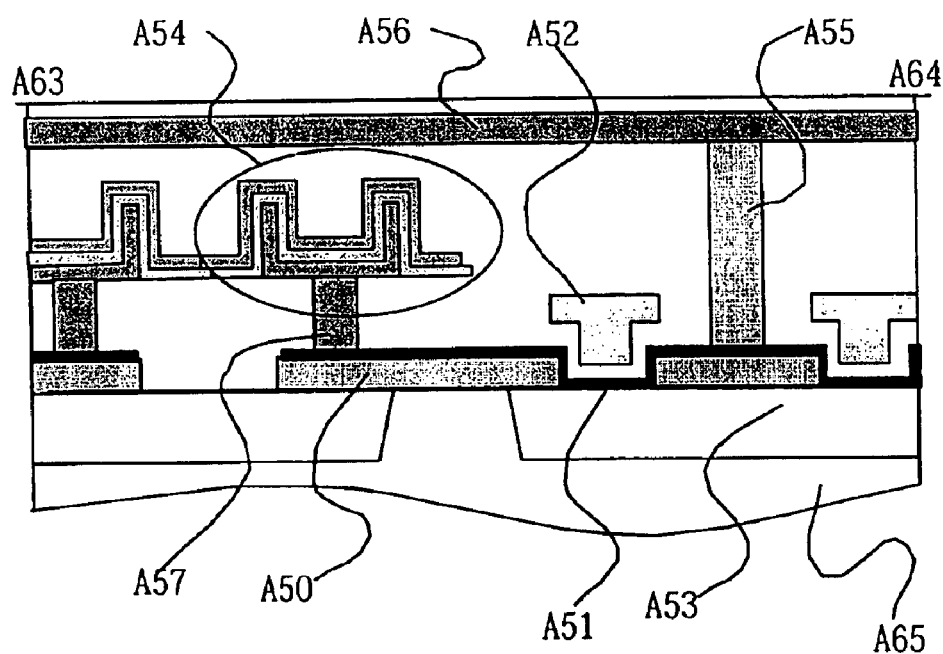
FIG. 30 is a cross-sectional view of a semiconductor memory array structure of an eleventh exemplary embodiment.
Figure 31:
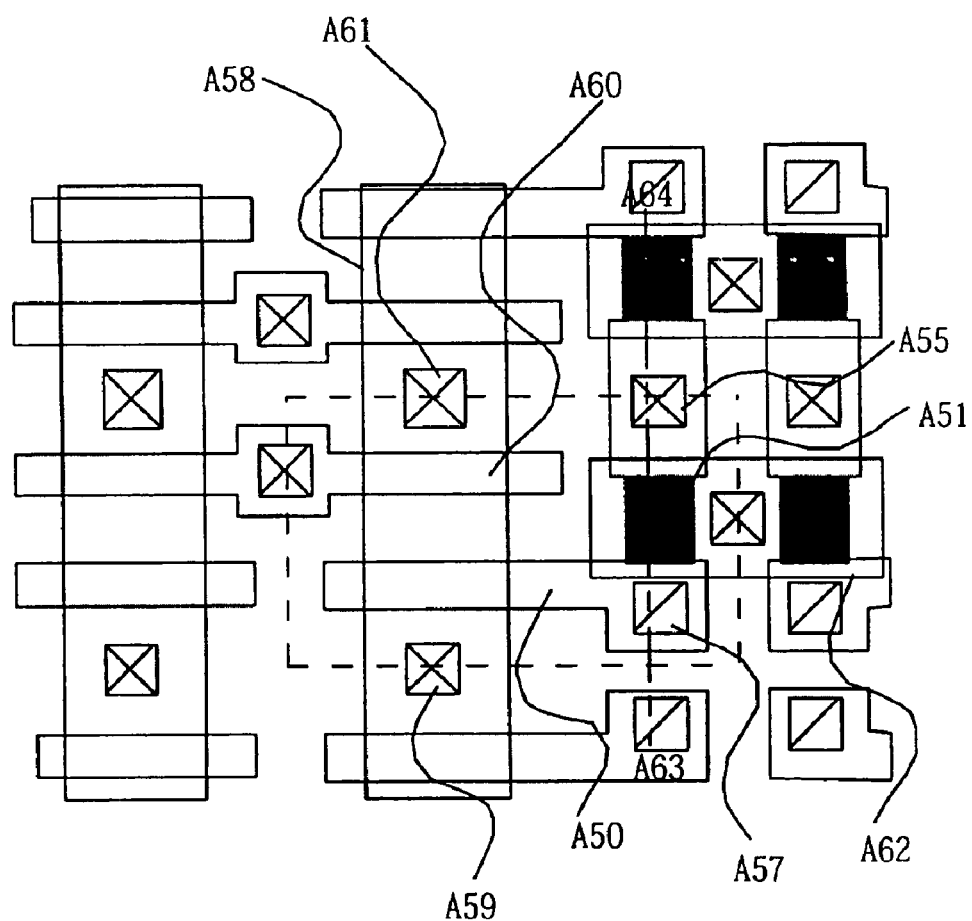
FIG. 31 shows a layout pattern for a semiconductor memory array.
Figure 32:
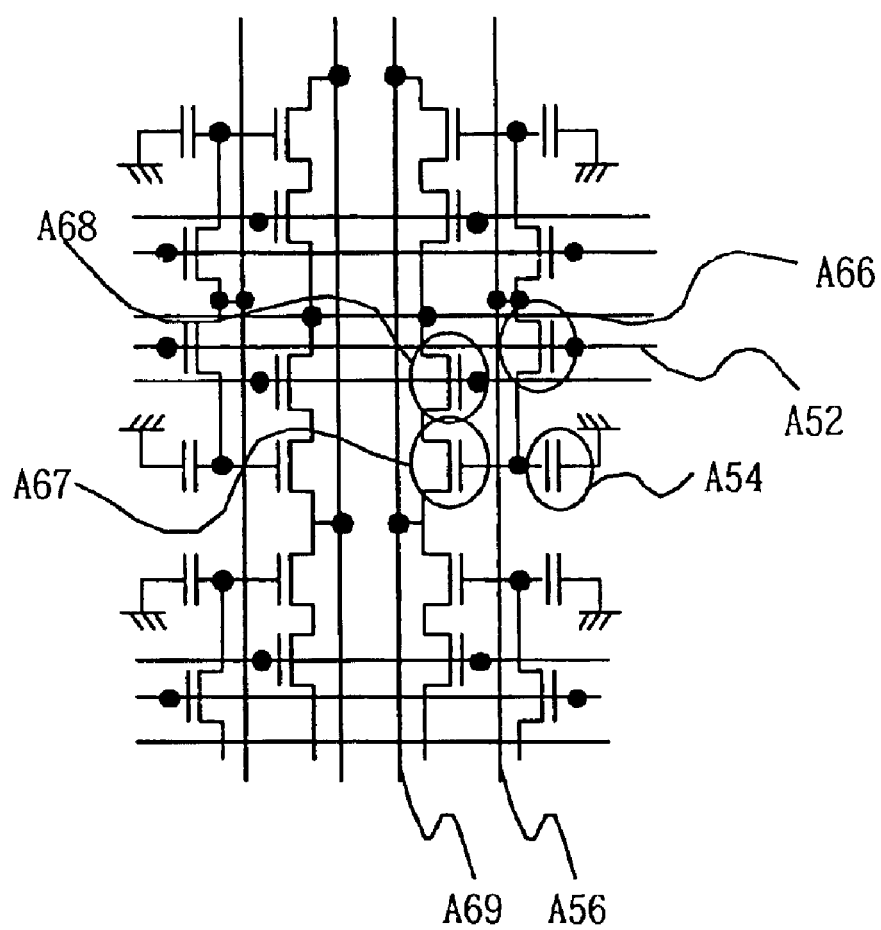
FIG. 32 is a cross-sectional view of a semiconductor memory array structure.

A eleventh exemplary embodiment provides a memory as detailed in FIGS. 30 to 32 having a memory cell with a three transistor structure according to the first embodiment. A difference is the use of an additional storage node A50 capacitance structure A54 connected to the storage node, enabling a large stored charge and thus permitting a memory with a very long retention time. The structure in FIG. 32 shows a separate write data line A56 and read data line A69, however these can be combined into a single data line to reduce the cell area. In addition, the gate A50 of the storage transistor A67 is connected to one terminal of a capacitive element A54 formed using $Ta_2O_5$. The other terminal of the capacitor is directly connected to a ground node.

For the memory cell in the first embodiment, the storage node has an estimated capacitance of 0.2 fF. However, with the use of the $Ta_2O_5$ capacitive structure A54, a storage capacitance of 20 fF can be realized. Moreover, if the channel region A51 thickness of the write transistor A66 is reduced to approximately 1.5 nm, a leakage current of $10^{-21}$A is exhibited under certain temperature conditions. With this configuration, a decrease in the store charge by 10% is estimated to require one month. This enables a memory device suitable for portable applications, for example, a cellular phone memory device that does not require a refresh period, effectively allowing a non-volatile memory device.

To adequately store information, the voltages of the gate region A52 and the source region A53 of the write transistor A66 must be fixed appropriately. When compared to conventional SRAM, the memory described in this embodiment can achieve a smaller cell area due to a reduction in the number of transistors. In addition, operation can be expected even for voltages as low as 1V, yielding a non-volatile memory that is less expensive than conventional flash memory or similar memory devices. If a tunneling oxide layer of around 10 nm is used along with high voltage transistors, voltage boosting circuits are unnecessary. Furthermore, unlike flash memory and other non-volatile memory devices, there is no limitation on the number of write operations that can be performed.

In the semi-volatile memory presented in this embodiment, a refresh operation could be carried out when the battery is recharged or replaced. Since an additional capacitor device is required, the fabrication process includes more steps than previous embodiments. However, this memory can be easily integrated along with DRAM and logic circuits to form a complete system with a non-volatile memory unit. In addition, since many analog and digital circuit processes already incorporate additional capacitor elements, this memory can be fabricated with few additional steps. This memory can also be used in combination with the memory technologies from the other embodiments in this invention on the same die. Finally, although this embodiment describes a vertical stacked capacitor as the storage element, this memory could substitute a trench capacitor buried in the silicon substrate at the expense of additional area.

The memory presented in this embodiment incorporates a high resistance write transistor to achieve a long retention time, however the write time is expected to be on the order of $1^{-6}$ seconds. This device will exhibit a fast read speed due to the use of conventional transistors as the storage and read devices.

Figure 33:
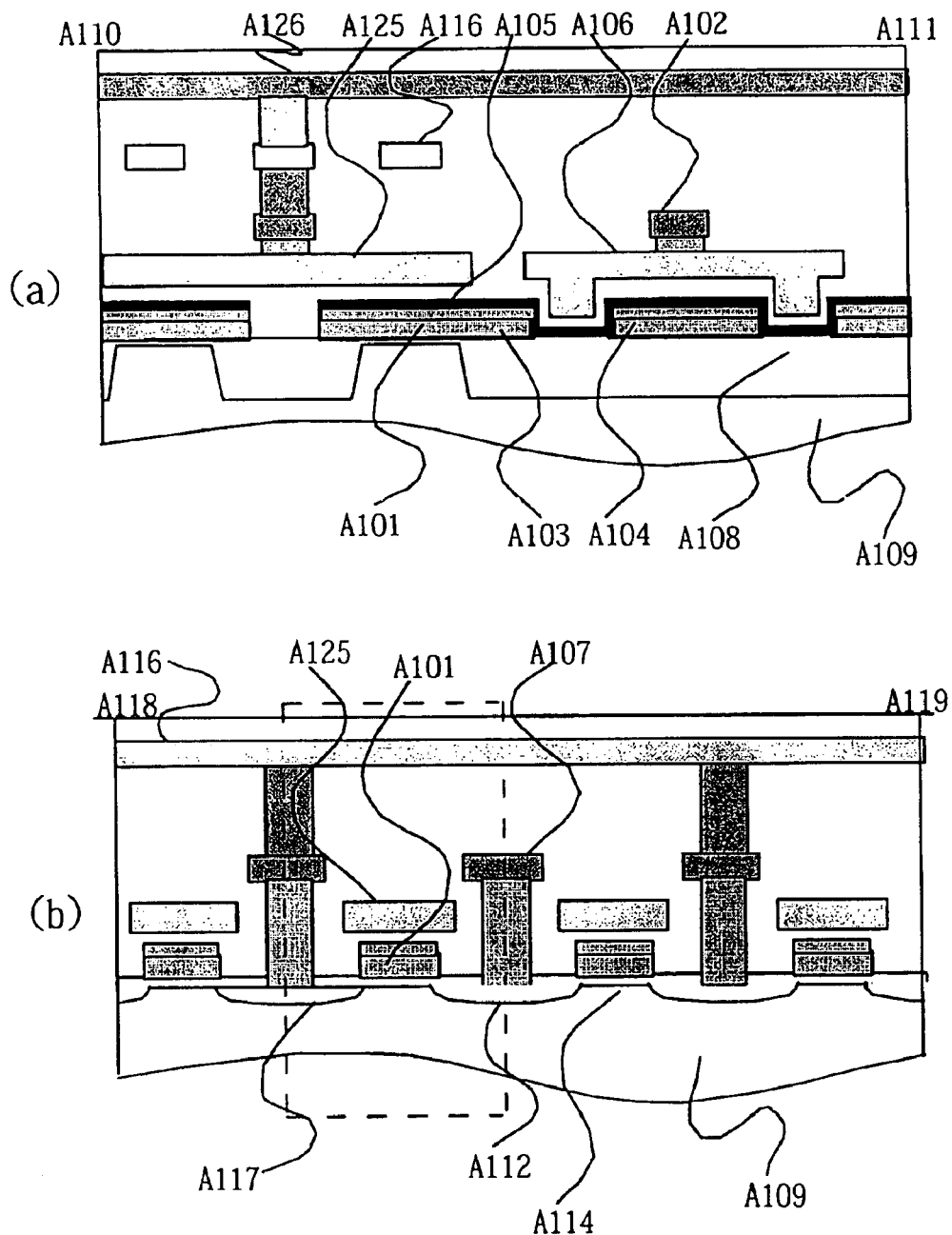
FIGS. 33A and 33B are cross-sectional views of a semiconductor memory array structure of a twelfth exemplary embodiment.
Figure 34:
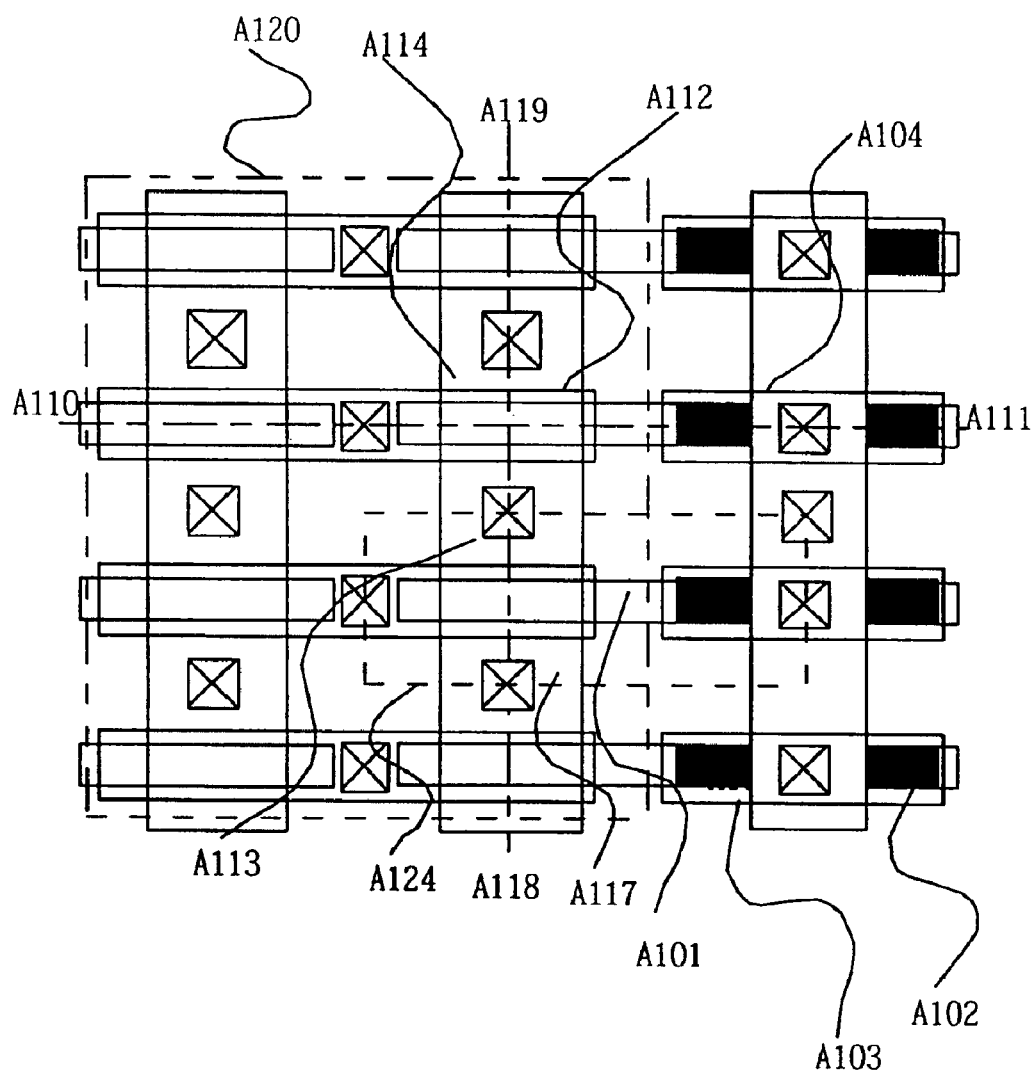
FIG. 34 shows a layout pattern for a semiconductor memory array of a twelfth exemplary embodiment.
Figure 35:
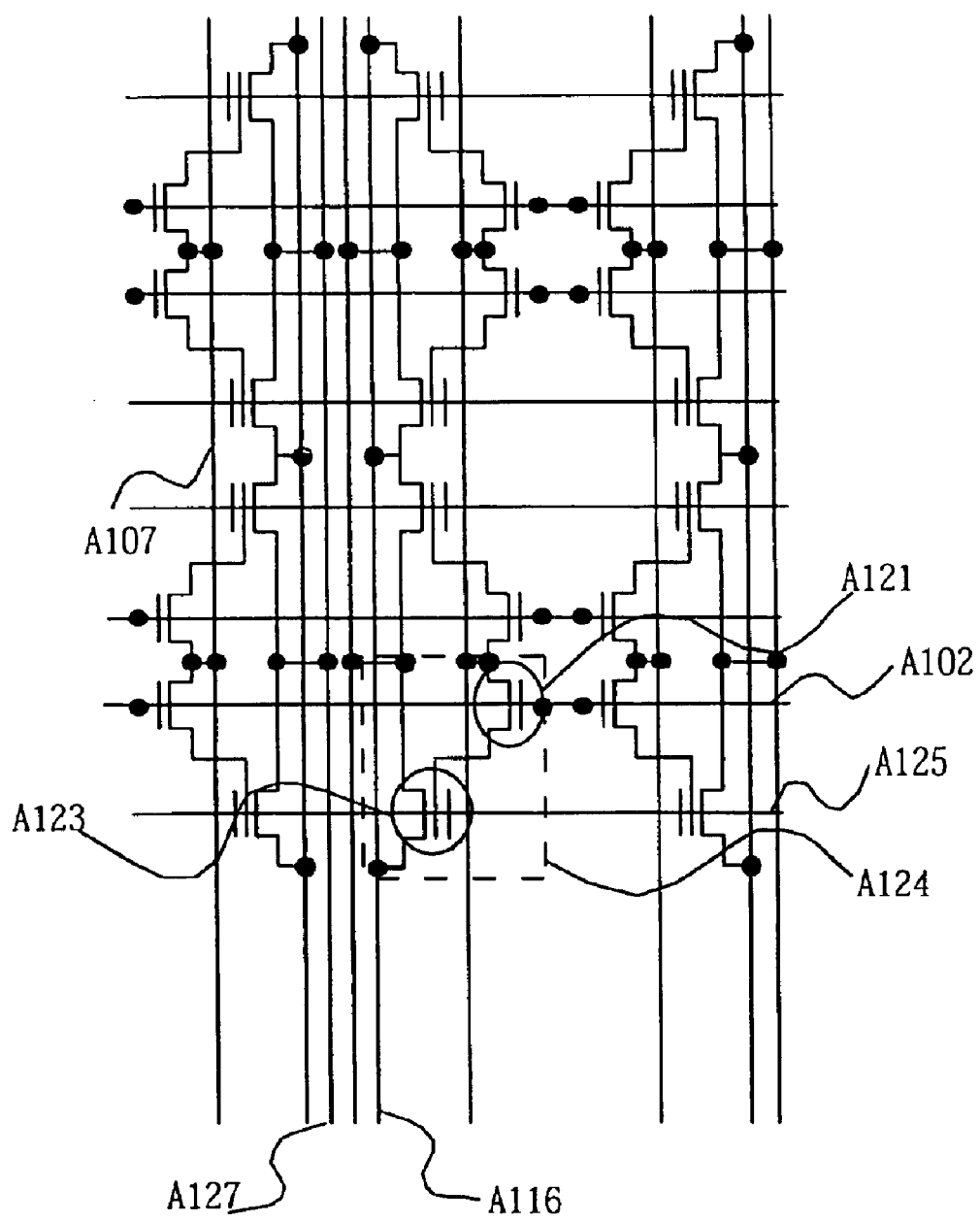
FIG. 35 is a schematic view for a semiconductor memory array.
Figure 36:
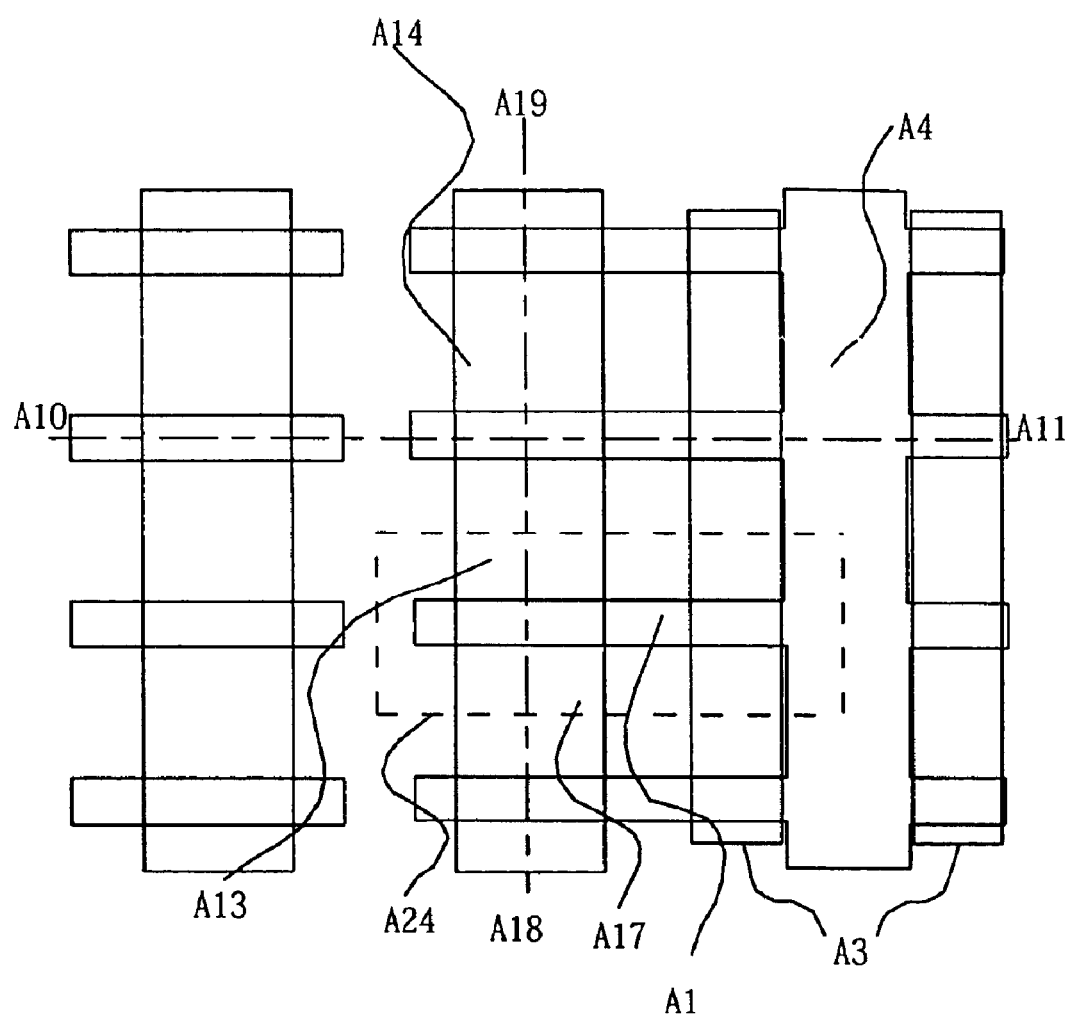
FIG. 36 shows a layout pattern for a semiconductor memory array.

A twelfth exemplary embodiment describes a memory according to FIGS. 33 to 36 utilizing a thin-channel transistor in the 2T configuration described in the third embodiment. In this memory, shown in FIG. 35, the write transistor A121 is formed from the thin-channel transistor as described in the seventh embodiment. FIG. 34 shows the layout for the unit cell A24 of this memory in a 4×3 configuration with the surrounding cells. The metal interconnect layers have been omitted for clarity of explanation. FIG. 36 shows the layout only for the transistors and first polysilicon layer. Cross sectional views between points A110 and A111 as well as A118 and A119 are shown in FIG. 33. The store transistor A123 is formed from a conventional N-channel bulk transistor. The word write line A102 and word read line A125 are formed on the third metal interconnect layer and run in the horizontal direction. The data line A116 is formed on the second metal interconnect layer and runs in the vertical direction. The source line A107 is formed on the first metal interconnect layer and runs in the horizontal direction.

An exemplary fabrication process follows the flow as presented in the memory of the seventh exemplary embodiment and only the differences will be explained. This flow is followed up to the point where the layer of polysilicon is deposited that forms the gate A104 of the thin-channel write transistor. In order to save processing steps, this layer is preferably also patterned with the second gate A112 of the storage transistor A123. After this polysilicon layer is etched and the resist is removed, appropriate contacts and metal layers are fabricated above these devices.

The operation and array schematic of this memory is identical to the memory presented in the third embodiment, which utilizes the capacitive coupling write method to storage data on the storage node, and will not be described here. This memory possesses several advantages as a volatile memory. In that only two transistors are used in a single memory cell, one of these being a thin-channel transistor fabricated above the insulation layer, a very small cell size can be realized, preferably as small as a conventional DRAM cell. In this manner, a very high-density memory can be realized. Similarly, as mentioned in the seventh embodiment, the thin-channel transistor has a much lower leakage current than a conventional transistor. Therefore, a long retention time can be realized for a cell using only the gate terminal of a transistor as a storage element. This in turn reduces the refresh operations in a given time and will result in a lower power memory unit.

A thirteenth exemplary embodiment enables a memory that can be shown by the figures of the twelfth embodiment (FIGS. 33 to 36) and describes a two transistor cell structure memory that incorporates a thin-channel transistor as presented in the seventh embodiment. A difference with this configuration is the use of a P-channel transistor as the storage transistor instead of an N-channel device. In this case, the thin-channel write transistor is an N-channel device in order to increase the speed of the write operation due to the higher electron mobility versus the P-channel device. The advantages to using a P-channel storage transistor have been detailed in the first embodiment and will not be described here.

The fabrication procedure is a combination of the procedures presented in the eighth embodiment and the twelfth embodiment. Namely, the process follows the eighth embodiment up until the deposition of the polysilicon layer used as gate terminal for the thin-channel transistor. It must be stressed that since the P-channel store transistor has a P-type polysilicon gate and the N-channel thin-channel device has an N-type polysilicon source and drain region, an additional mask A120 and silicidation step must be included similar to the eighth embodiment. As in the eighth embodiment, the polysilicon within this mask is implanted with a P-type dopant and the polysilicon outside this mask is implanted with an N-type dopant. Thus, the same polysilicon part can be used as both the gate of the P-type storage transistor and the source or drain of the N-type thin-channel write transistor. ☐ This mask and silicidation step will enable the storage transistor gate and write transistor source to be fabricated from a single body of polysilicon. This is advantageous in that it enables a compact cell area. Similar to the twelfth embodiment, the second gate of the storage transistor can be formed from the same deposited layer of polysilicon that is used as the gate of the thin-channel write transistor.

The array structure, sense amplifier, dummy cell, and refresh method may be all implemented according to the third embodiment and will not be described here. Some advantages of this memory cell are the small cell size due to the two transistor cell structure along with a high voltage margin under some conditions in which an N-channel storage transistor is not adequate.

A fourteenth exemplary embodiment enables a memory that can be shown by the figures of the twelfth embodiment (FIGS. 33 to 36) and describes a two transistor cell structure memory that incorporates a thin-channel transistor as presented in the seventh embodiment. Furthermore, this memory is organized in a manner similar to that of the parallel connected memory cell arrangement presented in the fifth embodiment. The layout diagrams are shown in FIGS. 34 and 36 and the cross-sectional views between points A110 and A111 as well as A118 and A119 are shown in FIG. 33. The schematic representation is shown in FIG. 35.

A difference in the layout and fabrication of this memory versus that in the twelfth embodiment is that the cells are arranged in a series of sub-column blocks as described in the fifth embodiment. Each cell in the sub-column block contains a storage transistor in which the drain region is connected to a read data line A116, and the source region is connected to the sub-column source data line A127. The sub-column source data line is connected in turn to the drain terminal of a sub-column access transistor QSL as in FIG. 18. In this manner, only one sub-column contributes to the current in a read operation as described in the fifth embodiment. Thus, this memory achieves the small area afforded by the twelfth embodiment, with a slight penalty for the area of the access transistor, but it presents a faster read operation since only the non-selected cells in the sub-column contribute to current noise during the read operation.

The processing is identical to that of the twelfth embodiment and will not be repeated here. In addition, the memory array structure, sensing mechanism, dummy cell concept, and refresh operation may be used according to the fifth embodiment, which uses the capacitive coupling write method. Several modifications can be made to the memory as presented in earlier embodiments. For example, a P-channel storage transistor can be used in place of the N-channel device. The advantages and processing changes are presented in the thirteenth embodiment and will not be described here.

A fifteenth exemplary embodiment enables a memory that can be shown by the figures of the twelfth embodiment (FIGS. 33 to 36) and describes a two transistor cell structure memory that incorporates a thin-channel transistor as presented in the seventh embodiment. Furthermore, this memory is organized in a manner similar to that of the series connected memory cell arrangement presented in the sixth embodiment. The layout diagrams are shown in FIGS. 34 and 36 and the cross-sectional views between points A110 and A111 as well as A118 and A119 are shown in FIG. 33. The schematic representation is shown in FIG. 35.

A difference in the layout and fabrication of this memory versus that in the twelfth embodiment is that the cells are arranged in a series of sub-column blocks as described in the sixth embodiment. In summary, the storage transistor QS of each memory cell is connected in series with the storage transistor in the adjacent memory cell. The storage transistor Q1 on one end of this sub-column series is connected to the data line and the storage transistor on the other end Qn is connected to an access transistor QSL, which is connected to a source data line DL0. The read and write access schemes are according to the capacitive coupling write method described in the sixth embodiment. One distinction between this embodiment and that of the sixth embodiment is the inclusion of the thin-channel write transistor as presented in the seventh embodiment. By including this device as the storage node access transistor, the retention time can be increased by a factor of one thousand versus a conventional transistor due to the low subthreshold current leakage.

The memory according to this embodiment preferably uses an open data line structure, a differential voltage sense amplifier, a dummy cell concept, and a refresh scheme according to that presented in the sixth embodiment and will not be repeated here. In addition, the processing flow is described in the fourteenth embodiment and will not be repeated here. This memory may use a P-channel storage transistor in place of the N-channel device for at least the reasons described in the first embodiment, and the processing methodology for this is presented in the eighth embodiment. Some advantages of this device are a smaller cell size than conventional DRAM due to the absence of drain and source contacts in the series connected store transistors. In addition, a retention time much longer than conventional DRAM can be exhibited.

Figure 37:
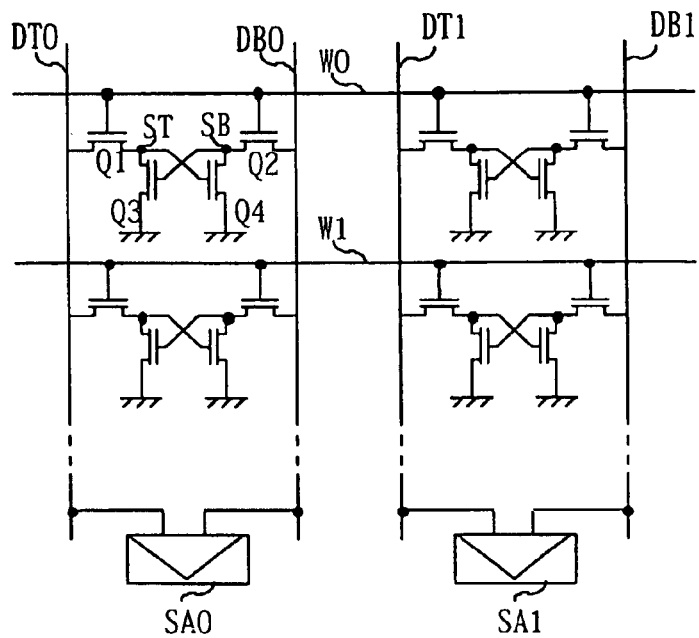
FIG. 37 is a circuit diagram for a semiconductor memory of a sixteenth exemplary embodiment.

A sixteenth exemplary embodiment provided a memory as shown in FIG. 37 such that each cell contains four transistors in a standard 4-T SRAM configuration. Furthermore, the transistors in the cell are arranged such that one pass transistor Q1 electrically connects the positive data line DT0 and the positive storage node NT when the transistor is activated by a word line W0 connected to the gate terminal. The other pass transistor Q2 electrically connects the negative data line DB0 and the negative store node NB when activated by the same word line W0 connected to the gate terminal. There is a storage transistor Q3 with a source region connected to a ground node, a drain region connected to the positive storage node NT and the gate electrode connected to the negative store node NB. Finally, a storage transistor Q4 has a source region connected to a ground node, a drain region connected to the negative store node NB and the gate electrode connected to the positive store node NT.

A distinction of the memory in this embodiment is that the storage transistors Q3,Q4 are realized by thin-channel polysilicon transistors as described in the seventh embodiment. There are several advantages to using this configuration. As will be explained below, this memory is a static memory type that operates with a refresh period. Therefore, the power consumption contributed to refresh operations can be omitted. Since the thin-channel store transistors are fabricated above the insulation layer, as described in the seventh embodiment, a small cell size can be realized that is up to three times smaller than a conventional SRAM cell. In addition, since the thin-channel store transistors exhibit a leakage current up to four orders of magnitude lower than conventional transistors, this memory cell consumes much lower power than conventional SRAM in the standby state.

An exemplary access operation will now be described. This operation applies for N-channel pass transistors Q1, Q2, but this memory functions in the same manner if the pass transistors are of the P-channel type. In that case, the polarity of the word line W0 is reversed. As shown in the waveforms in FIGS. 38A and 38B, in the standby state, the word line W0 is held low, isolating the storage nodes from the data lines. In the case that a high value is stored in the cell, a high voltage (2V) is stored on the positive storage node NT, and a low voltage (0V) is stored on the negative store node NB. The high voltage on the positive node activates the storage transistor Q3, effectively holding the negative node NB at a low voltage (0V).

The critical point of the operation is for the positive node at a high voltage. In this case, the mechanism that restores the node is leakage current from the positive data line DT0. If the leakage current from the data line DT0 to the storage node NT through the channel of the pass transistor Q1 is higher than charge leakage from the positive storage node NT through the store transistor Q3 and to the well, then the node is self-restoring. In other words, if a charge leaks from the high voltage positive store node NT, a charge will flow from the positive data line DT0 until the node is equalized to the data line. By the same token, for a low voltage value on the positive store node, the reverse is true. The negative store node NB is kept at a high voltage due to the leakage current from the negative data line DB0. Since the thin-channel transistor exhibits a much lower leakage current than a conventional transistor, this relationship will hold, and a low-leakage, small area static memory cell can be realized.

Figure 38A:
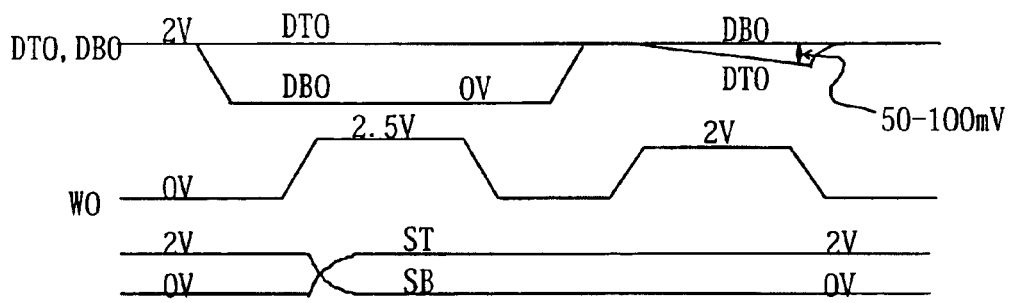
FIGS. 38A and 38B shows the write and read access waveforms for a semiconductor memory.
Figure 38B:
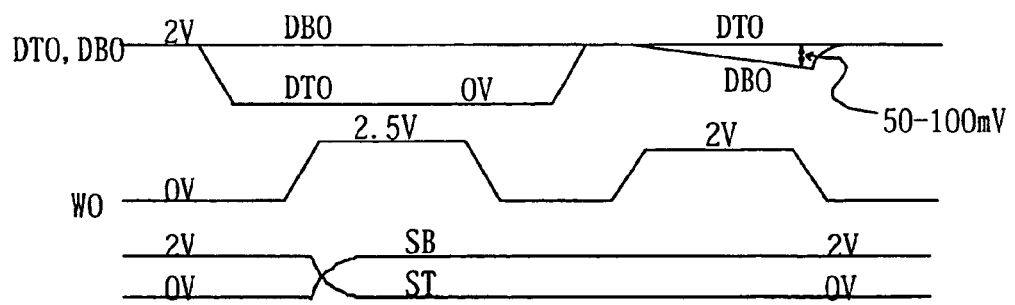

Read and write access are identical to a conventional SRAM circuit, the high data write shown in FIG. 38A and the low data write shown in FIG. 38B, and will not be described here in detail. In summary, for a high value write cycle, a high voltage (2V) is presented to the positive data line DT0 and a low voltage (0V) is presented to the negative data line DB0. The word line W0 is activated, transferring the voltage on the data lines to the store nodes NT, NB. After the word line is lowered, the data lines are returned to the high voltage standby state (2V) and the data is held statically as described previously. The read operation comprises floating the data lines DT0, DB0 and activating the pass transistors. A current path forms from the data lines through the cell and a differential voltage is developed on the data lines. This differential signal is discriminated by a sense amplifier, SA0 and the data is output to the system bus. The fabrication technique for the thin-channel transistor is described in more detail in the eighteenth embodiment.

Figure 39:
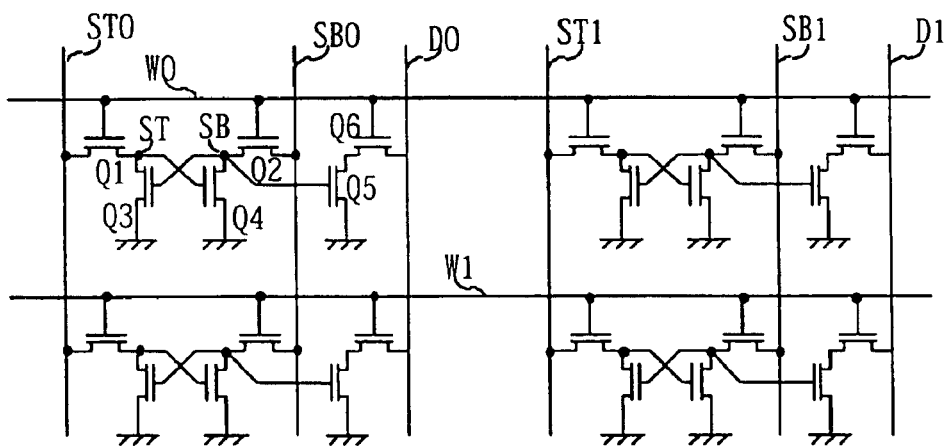
FIG. 39 is a circuit diagram for a semiconductor memory of a seventeenth exemplary embodiment.

A seventeenth exemplary embodiment provides a memory as shown in FIG. 39 such that each cell contains six transistors, four of which are arranged in a standard four transistor configuration as described in the sixteenth embodiment, and two transistors are arranged in a manner to allow a fast readout of the cell data. The pass transistors Q1, Q2 are connected to the write data lines ST0, SB0 and thin-channel store transistors Q3,Q4 are arranged such that a data value is stored statically on the store nodes NT, NB. In the sixteenth embodiment, since the current path runs through the thin-channel store transistors, the read operation may be much slower than in a conventional SRAM. For this reason, two transistors are added to enhance the read operation speed. A readout transistor Q5 has a source region connected to ground (0V) and the gate electrode connected to the negative store node NB. An access transistor Q6 has a source region connected to the drain region of transistor Q5, a gate terminal connected to the word line W0 and a drain region connected to the read data line D0.

Figure 40A:
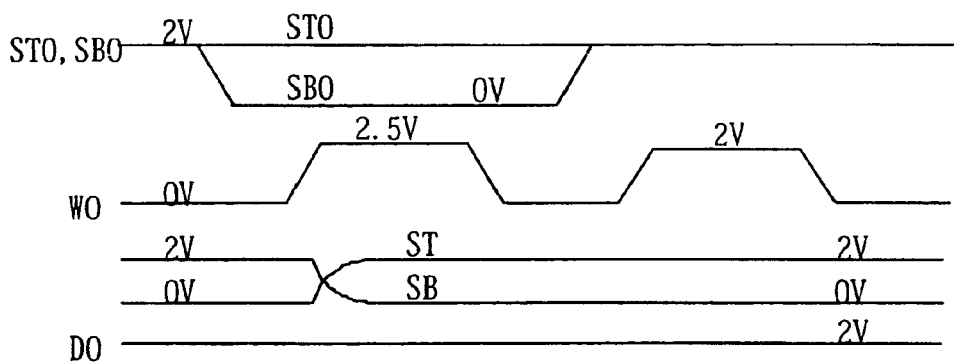
FIGS. 40A and 40B shows the write and read access waveforms for a semiconductor memory.
Figure 40B:
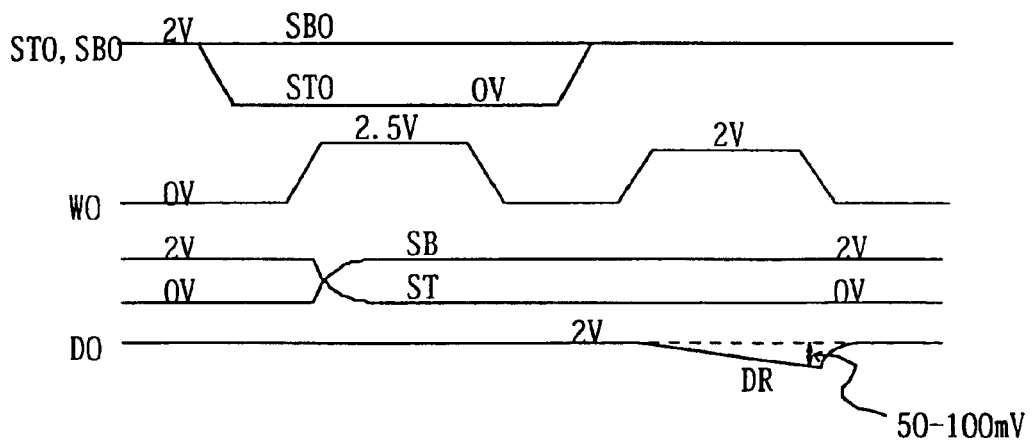
Figure 41:
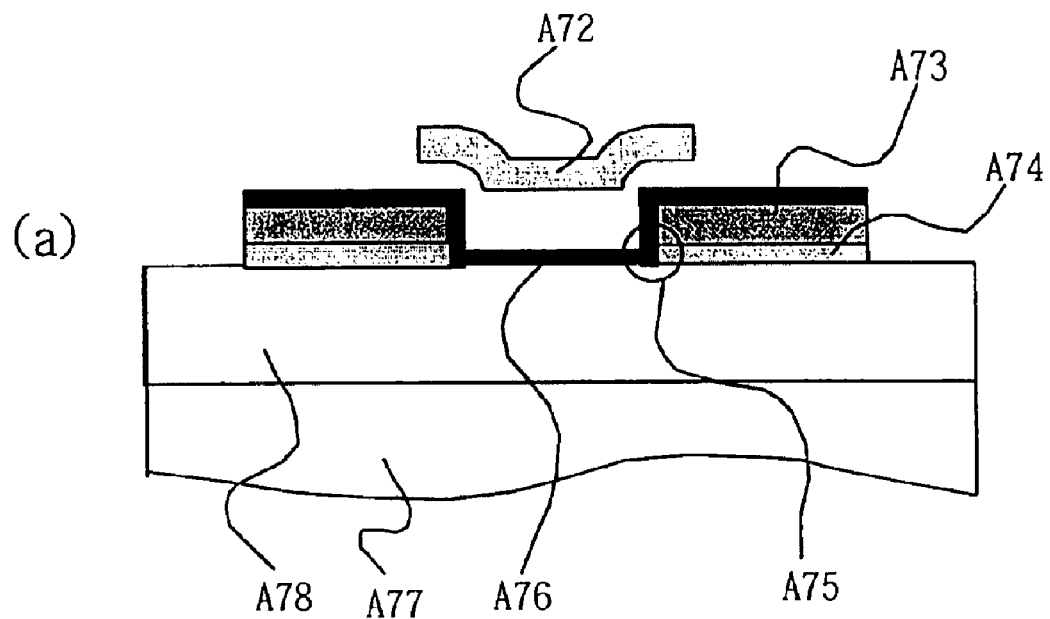
FIGS. 41A and 41B are cross-sectional views of a semiconductor device of an eighteenth exemplary embodiment.
Figure 41:
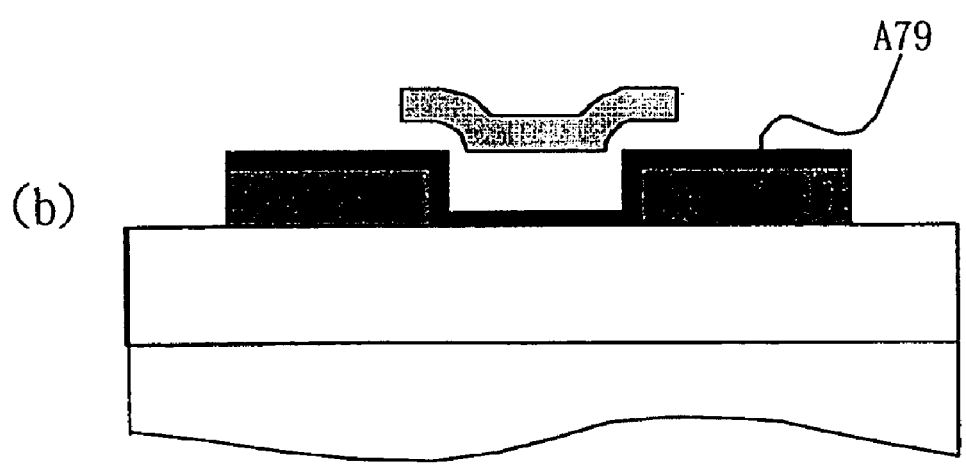

The access operation is similar to the operation in the sixteenth embodiment and only the differences will be explained here. FIG. 40A shows the high data access operation and FIG. 40B shows the low data access operation. The write operation follows a similar pattern with voltages of opposite polarity presented to the write data lines ST0, ST1, with a high voltage (2V) presented to the positive write data line in the high value write operation and a low voltage (0V) presented to the positive write data line in the low value write operation as described in the sixteenth embodiment. For the read operation, the word line is raised to a high voltage (2V) as in the sixteenth embodiment. The difference is that the voltage on the read data line D0 is sensed rather than the write data lines. Since the negative store node NB is connected to the gate of the readout transistor Q6, the transistor is in the conduction state when the negative store node NB has a high stored voltage (2V), and the transistor is shut off when the negative store node NB has a low stored voltage (0V). Since a current path exists from the read data line through the access and readout transistors, the voltage on the read data line will fall at a rate determined by the voltage on the negative store node NB. This voltage can be sensed by a sense amplifier connected to the read data line and a digital signal representing the memory cell contents can be generated and output to the signal bus. Since the read and access transistor are of the conventional type, a large current can be generated, resulting in a faster read operation than that achievable in the sixteenth embodiment. The drawback is additional area due to the additional data line and the additional transistors. However, since the memory cell exhibits a much lower leakage current than a standard SRAM, the power consumption can be reduced.

A eighteenth exemplary embodiment is shown in FIGS. 41 to 44. In this embodiment, the thin-channel write transistor used in previous embodiments is presented. Due to the low leakage characteristics of this device, by incorporating it in a dynamic memory configuration, a long retention time can be realized, yielding memory with lower power consumption than conventional DRAM. Arranged in an SRAM configuration, the leakage current in the storage stage is reduced, yielding a low power static memory device. To realize the low leakage characteristics required in this invention, a thin-channel layer transistor is employed. For clarity of explanation, only the thin-channel transistor will be shown. In principle, the various thin-channel write transistors described in this embodiment can be used as the write transistor in any of the embodiments presented in this invention.

The thin-channel write transistor shown in FIG. 41(a) is fabricated on the insulation layer of a N-well A77. One characteristic of this device is that the drain and source regions are fabricated from multi-layer polysilicon in which the upper layer is comprised of highly doped N-type polysilicon and the lower layer is comprised of lowly doped N-type or intrinsic polysilicon. A 3 nm thick intrinsic polysilicon layer forms the channel region A76, and the gate terminal A72 is formed from a layer of highly doped N-type polysilicon. At the connection between the source and drain regions and the channel region, the doping density of the polysilicon is decreased, preventing the diffusion of dopants into the channel region even under subsequent high temperature processing steps. In this manner, a steep junction between the two regions is avoided, further reducing the leakage current of the device. A lightly doped N-type or intrinsic polysilicon layer is first deposited, followed by the deposition of a highly doped N-type polysilicon layer, which will act as the source and drain region of the transistor. A layer of amorphous silicon is then deposited that forms the channel region connecting the source and drain region.

Ideally, the source and drain structure presented in FIG. 41(b) is fabricated in which the dopant concentration gradually decreases from the top to the bottom of the polysilicon structure.

Figure 42:
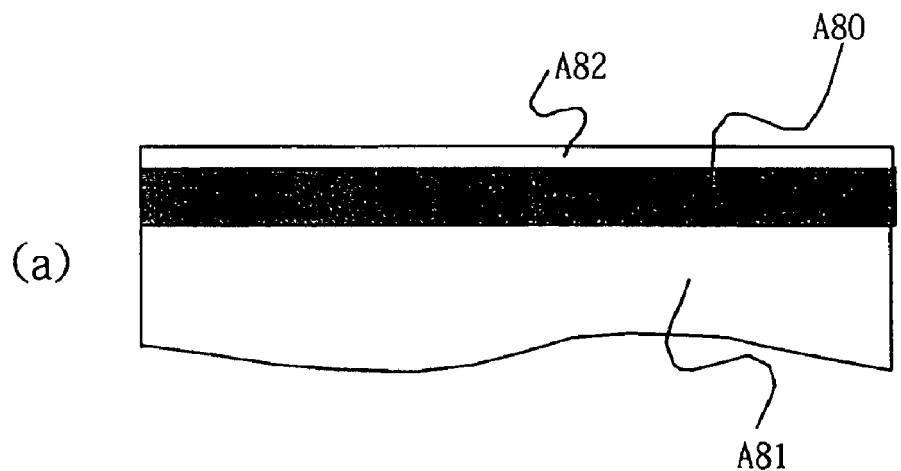
FIGS. 42A and 42B are cross-sectional views of a semiconductor device.
Figure 42:
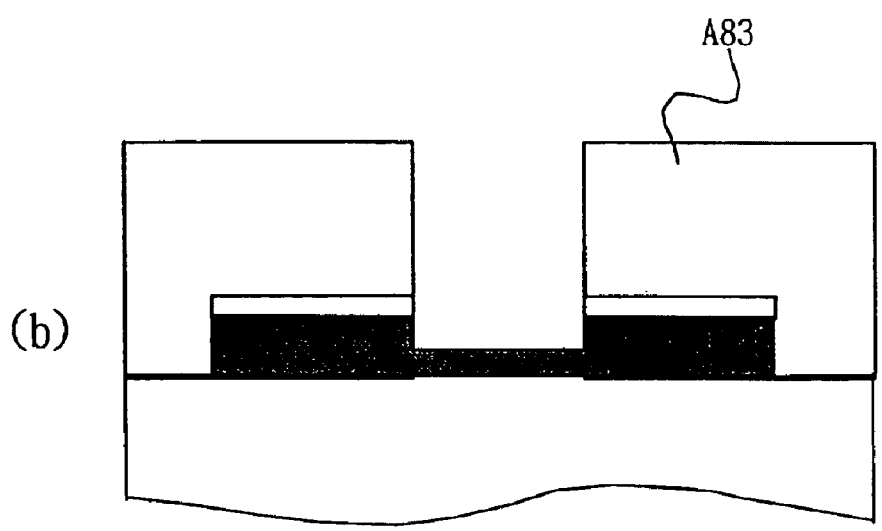
Figure 43:
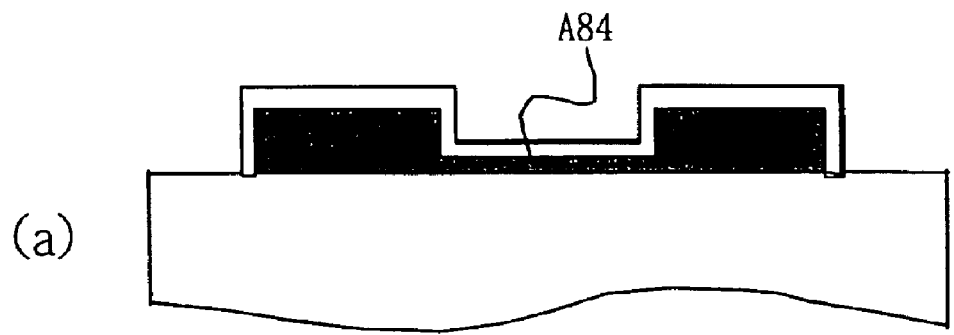
FIGS. 43A and 43B are cross-sectional views of a semiconductor device.
Figure 43:
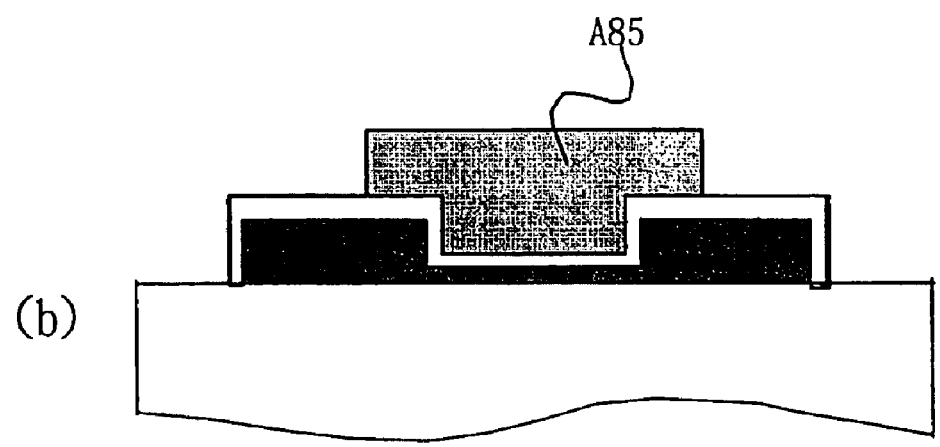

FIGS. 42 and 43 show the fabrication steps for another thin-channel write transistor structure. In this case, an SOI wafer is used so that the channel region of the device is comprised of single-crystal silicon. By using single-crystal silicon for the channel region instead of polysilicon, not only does the device exhibit greater "on" current due to the increased mobility, the device also exhibits a higher subthreshold coefficient due to a lower trap site density and lower leakage stemming from a reduction in the number of grain boundaries.

The fabrication of the structure is now explained. Using a SOI wafer with a 50 nm thick layer of silicon, a low energy N-type doping ion implantation is performed followed by a diffusion process to distribute the dopants through the silicon layer. The surface of the silicon layer A80 above the $SiO_2$ layer A81 is oxidized, forming a layer of $SiO_2$ A82 (see, FIG. 42(a)). A mask is used to pattern a layer of photoresist and an etching step is executed to form the source, drain, and channel regions. A separate resist pattern A83 is used to etch the $SiO_2$ and silicon such that a 10 nm thick layer of silicon remains (see, FIG. 42(b)). The resist is removed and the exposed silicon is oxidized, leaving a 7 nm thick layer of $SiO_2$ above the 3 nm thick channel region A84 (see, FIG. 43(a)). N-type polysilicon is deposited, patterned, and etched to form the gate electrode A85 of the transistor (see, FIG. 43(b)).

Figure 44:
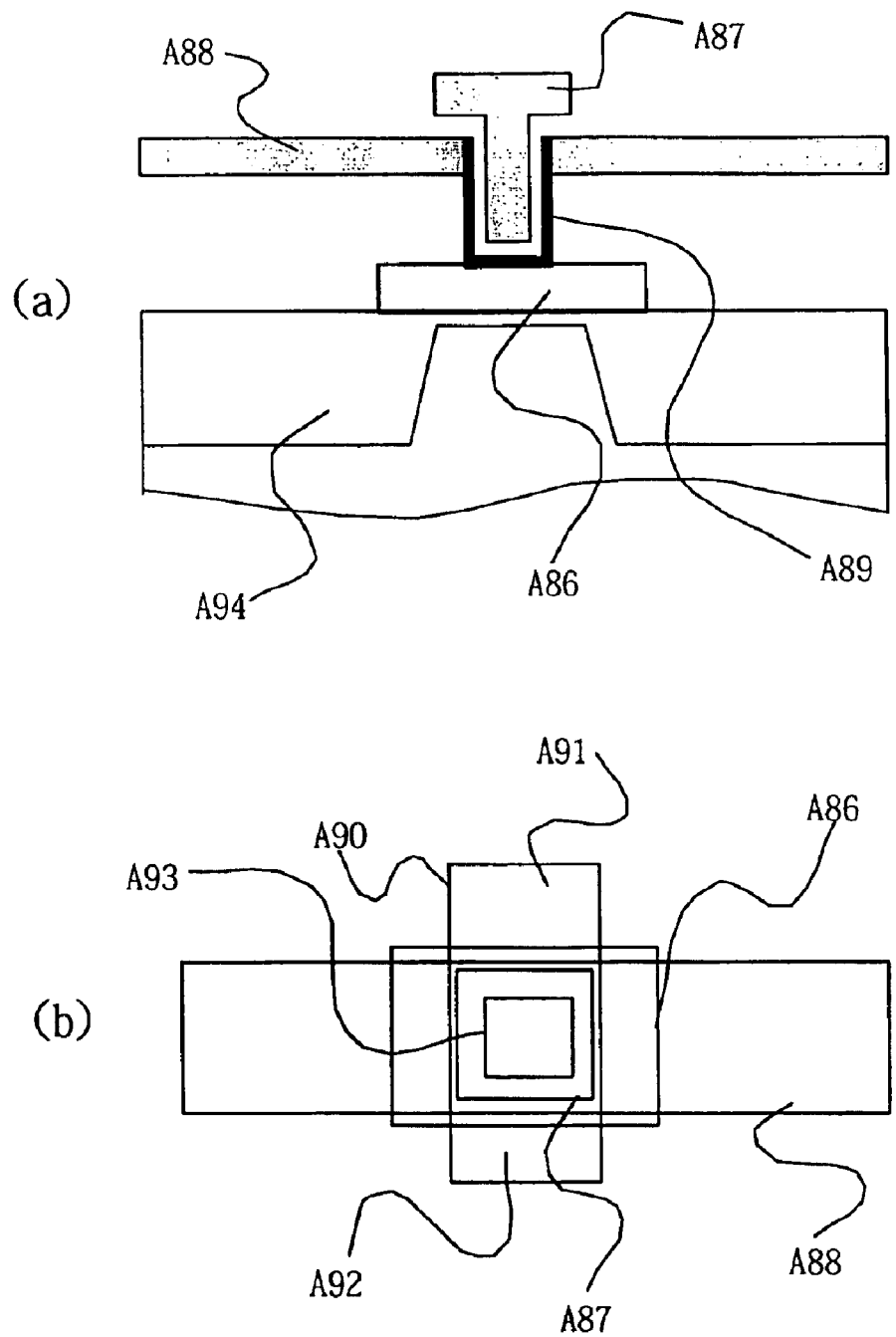
FIGS. 44A and 44B are cross-sectional views and layout patterns for a semiconductor device.

Another thin-channel write transistor structure is shown in FIG. 44. A cross-sectional view is shown in FIG. 44(a), and the layout for this structure is shown in FIG. 44(b). In this structure, the write transistor is vertically fabricated and combined with the store transistor, yielding a low area device structure. The gate region A86 of the store transistor is fabricated above an isolation layer A94 such that it crosses over the active region A90. This structure simultaneously defines the source A91 and drain A92 regions of the read transistor. The source A86 and drain A87 A88 regions of the write transistor are formed from N-type polysilicon such that the drain is positioned vertically above the source. The source region A86 of the write transistor is connected to the gate electrode A86 of the store transistor, and the drain region A88 is connected to the write data line. The channel region A89 of the write transistor is formed along the inside of the hole pattern A93 which penetrates the write data line.

The control electrode A87 for the channel A89 is formed from P-type polysilicon and is connected to the write word line through a contact hole. By using P-type polysilicon, the threshold voltage of the write transistor may be set such that the leakage current is a minimum when the control voltage is around 0 V. For this embodiment, after the storage transistor is constructed, a insulation layer is formed, followed by the deposition of N-type polysilicon. A resist pattern is masked such that a hole A93 is etched through the N-type polysilicon to the gate electrode of the store transistor. A 3.5 nm thick layer of amorphous polysilicon is deposited, followed by a deposition of insulation and a crystallization step. Another resist layer is patterned and the gate electrode of the write transistor is formed A87. The write data line A88 is then patterned and etched. Finally, various contact and interconnection metal layers are formed above the device.

Nothing in the above description is meant to limit the present invention to any specific materials, geometry, or orientation of parts. Many part/orientation substitutions are contemplated within the scope of the present invention. The embodiments described herein were presented by way of example only and should not be used to limit the scope of the invention.

Although the invention has been described in terms of particular embodiments in an application, one of ordinary skill in the art, in light of the teachings herein, can generate additional embodiments and modifications without departing from the spirit of, or exceeding the scope of, the claimed invention. Accordingly, it is understood that the drawings and the descriptions herein are proffered by way of example only to facilitate comprehension of the invention and should not be construed to limit the scope thereof.

What is claimed is:

1. A semiconductor memory element comprised of:
    a plurality of word lines;
    a plurality of data lines; and
    memory cells at the intersections of the word lines and data lines, each memory cell being comprised of
    a storage transistor with a gate terminal electrically connected to a storage node and one of a source or drain region connected to a predetermined potential,
    a read transistor with a gate terminal electrically connected to a read word line and a source or drain region connected to the other one of said a source or drain region of the storage transistor and the other one of the source or drain region of the read transistor connected to one of the data lines, and
    a semiconductor write device with a gate terminal electrically connected to a write word line and one of a source or drain region of the write device connected to a second one of said data lines and the other one of the source or drain region of the write device connected to the storage node, wherein said semiconductor write device source region and drain region are fabricated from metal or a semiconductor material connected by a channel which is formed by a semiconductor material with a thickness of no more than 5 nanometers on top of an insulating film, wherein said one side surface of said channel is substantially located on a same plane as said source region and drain region, and another side surface of said channel is located in a different plane from said source region and drain region.

2. A semiconductor element according to claim 1, further comprising a plurality of sense amplifiers, wherein one of said sense amplifiers is connected to each data line to amplify a signal during a read operation.

3. A semiconductor element according to claim 2, wherein the storage transistor is an N-channel MOS device.

4. A semiconductor element according to claim 3, wherein a refresh operation is conducted in a manner such that a signal on a read data line is amplified and applied to a write data line through a pass transistor, followed by the activation of the write transistor to store the data.

5. A semiconductor element according to claim 3, wherein a write data line and a read data line are connected via transistor.

6. A semiconductor element according to claim 5, wherein a refresh operation is conducted in such a manner that the signal on a data line is amplified, followed by the activation of the write transistor to store the data.

7. A semiconductor memory element, comprised of:
    a plurality of word lines;
    a plurality of data lines; and
    memory cells at the intersections of the word lines and data lines, each of said memory cells comprising a storage transistor with a gate terminal electrically connected to a storage node and one of a source or drain region connected to a predetermined potential, a semiconductor write transistor activated by a write word line electrically connected to the storage node wherein one of a source or drain region of the semiconductor write transistor is connected to one of the data lines and the other one of the source or drain region of the semiconductor write transistor is connected to the storage node, wherein said semiconductor write device transistor has a source region and drain region are fabricated from a conductor connected by a channel which is formed by a semiconductor material of a thickness of no more than 5 nanometers on top of an insulating film, further wherein a first side surface of said channel is substantially located on a same plane as said source region and drain region of said write transistor, and a second side surface of said channel is located in a different plane from said source region and drain region of said write transistor.

8. A semiconductor memory element according to claim 7, wherein said conductor is a metal or a semiconductor material.

9. A semiconductor memory element according to claim 8, wherein the source or drain of the write transistor that is electrically connected to the gate terminal of the storage transistor is formed from a single body of polysilicon.

10. A semiconductor memory element according to claim 9, wherein the polysilicon gate terminal of the storage transistor has an first conductivity type impurity and the polysilicon source and drain region of the write transistor has an second conductivity type impurity which is of the opposite type from said first conductivity type.

11. A semiconductor memory element according to claim 8, wherein the upper part of the polysilicon drain and source regions of the write transistor has a higher concentration of impurities than the lower part of the polysilicon drain and source regions.

12. A semiconductor memory element according to claim 8, wherein a vertical stack comprising of a layer of polysilicon with one type of doping, a layer of metal or silicide, and a layer of polysilicon of the opposite type of doping is used in a manner such that the lower part of the stack is the gate terminal of the storage transistor and the upper part of the stack is the source or drain region of the write transistor.

13. A semiconductor memory element according to claim 8, wherein one of the source or drain of the write transistor is fabricated vertically above the source or drain of the storage transistor, and further wherein these two vertically oriented terminals are connected electrically by a contact between the two terminals.

14. A semiconductor memory element, comprised of:

a plurality of word lines;

a plurality of data lines; and memory cells at the intersections of the word lines and data lines, each of said memory cells comprising a storage transistor with a gate terminal electrically connected to a storage node and one of a source of drain region connected to a predetermined potential, and a semiconductor write device activated by a write word line electrically connected to the gate terminal of the write device and one of a source or drain region of the semiconductor write device is connected to one of the data lines and the other one of the source or drain region of the semiconductor write device is connected to the storage node;

wherein said semiconductor write device source region and drain region are fabricated from metal or a semiconductor material connected by a channel which is formed by a semiconductor material with a thickness of no more than 5 nanometers on top of an insulating film, wherein one side surface of said channel is substantially located on a same plane as said source region and drain region of the write device, and a second side surface of said channel is located in a different plane from said source region and drain region of the write device;

wherein each of a pair of memory cells is connected to a separate data line and further wherein the source or drain regions of the semiconductor write devices of each of the pair of memory cells that are not connected to the storage nodes in the respective cells are electrically connected.

15. A semiconductor memory cell, comprising:

a first switch element, and a first capacitor element, wherein a first terminal of the first capacitor element is electrically connected to a first terminal of the first switch element at a storage node, and a second terminal of the first capacitor element is connected to a reference potential, wherein said first switch element is adapted to transfer a charge to the storage node based on a voltage of an external data line, and the storage node is coupled to said external data line by capacitive coupling and further said external data line is adapted to obtain at least two voltage values Vd1 and Vd2, wherein said Vd1>Nd2 and, during a write operation to the memory cell, the charge stored at the storage node is Qs1 when a voltage of the external data lines is Vd1, and Qs2 when a voltage of the external data lines is Vd2, and wherein said Qs1 is smaller than said Qs2, and wherein said switch element has a source region and drain region fabricated from metal or a semiconductor material connected by a channel which is formed by a semiconductor material with a thickness no more than 5 nanometers on top of an insulating film, wherein one side surface of said channel is substantially located on a same plane as said source region and drain region of said switch element and a second side surface of said channel is located in a different plane from said source region and drain region.

16. A semiconductor memory element comprised of:

a plurality of read and write word lines;

a plurality of read and write data lines; and memory cells at the intersections of the word lines and data lines, each memory cell being comprised of a storage transistor with a gate terminal electrically connected to a storage node and one of a source or drain region connected to a predetermined potential, a read transistor with a gate terminal electrically connected to a read word line and a source or drain region connected to the other one of said source or drain region of the storage transistor and the other one of the source or drain region of the read transistor connected to a read data line, and a semiconductor write transistor with a gate terminal electrically connected to a write word line and one of a source or drain region of the write transistor connected to a write data line and the other one of the source or drain region of the write transistor connected to the storage node, wherein said semiconductor write transistor source region and drain region fabricated from metal or a semiconductor material connected by a channel which is formed by a semiconductor material with a thickness of no more than 5 nanometers on top of an insulating film, wherein one side surface of said channel is substantially located on a same plane as said source region and drain region of the write transistor, and a second side surface of said channel is located in a different plane from said source region and drain region of the write transistor.

17. A semiconductor element according to claim 16, further comprising a plurality of sense amplifiers, wherein one of said sense amplifiers is connected to each read data line to amplify a signal during a read operation.

* * * * *